(12) United States Patent
You

(10) Patent No.: US 11,616,115 B2
(45) Date of Patent: Mar. 28, 2023

(54) DISPLAY DEVICE

(71) Applicant: Samsung Display Co., LTD., Yongin-si (KR)

(72) Inventor: Chun Gi You, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 155 days.

(21) Appl. No.: 17/142,401

(22) Filed: Jan. 6, 2021

(65) Prior Publication Data

US 2021/0376037 A1     Dec. 2, 2021

(30) Foreign Application Priority Data

May 26, 2020   (KR) .......................... 10-2020-0063157

(51) Int. Cl.
    *H01L 27/32*  (2006.01)
    *H01L 51/52*  (2006.01)

(52) U.S. Cl.
    CPC ...... *H01L 27/3276* (2013.01); *H01L 51/5212* (2013.01); *H01L 51/5253* (2013.01)

(58) Field of Classification Search
None
See application file for complete search history.

(56) References Cited

U.S. PATENT DOCUMENTS

| | | | | |
|---|---|---|---|---|
| 2016/0079564 A1* | 3/2016 | Shim | ................... | H01L 27/3246 257/40 |
| 2018/0097034 A1* | 4/2018 | Lee | ...................... | H01L 51/5253 |
| 2018/0102502 A1* | 4/2018 | Kim | .................... | H01L 27/3258 |
| 2018/0158894 A1* | 6/2018 | Park | .................... | H01L 27/3276 |
| 2018/0287093 A1* | 10/2018 | Lee | ...................... | H01L 27/3246 |

FOREIGN PATENT DOCUMENTS

| | | |
|---|---|---|
| KR | 1020050064753 A | 6/2005 |
| KR | 1020170134828 A | 12/2017 |
| KR | 1020180039801 A | 4/2018 |
| KR | 1020190056477 A | 5/2019 |
| KR | 1020190090111 A | 8/2019 |

* cited by examiner

*Primary Examiner* — Khaja Ahmad
(74) *Attorney, Agent, or Firm* — Cantor Colburn LLP

(57) ABSTRACT

A display device includes a substrate including a display area at which an image is displayed and a non-display area which is adjacent to the display area, and in the non-display area a common voltage transmitting line which is connected to the display area and through which a common voltage is provided to the display area, an organic insulating layer between the common voltage transmitting line and the substrate, a first opening which is in the common voltage transmitting line and exposes the organic insulating layer to outside the common voltage transmitting line and an auxiliary electrode which faces the organic insulating layer with the common voltage transmitting line therebetween, contacts the common voltage transmitting line at the first opening and covers the first opening.

20 Claims, 17 Drawing Sheets

DISPLAY DEVICE

This application claims priority to Korean Patent Application No. 10-2020-0063157 filed on May 26, 2020, and all the benefits accruing therefrom under 35 U.S.C. § 119, the entire contents of which are incorporated herein by reference.

BACKGROUND

1. Field

The disclosure relates to a display device.

2. Description of the Related Art

A display device includes a liquid crystal display ("LCD"), a plasma display panel ("PDP"), an organic light emitting diode ("OLED") device, a field effect display ("FED") and an electrophoretic display.

A pixel of the organic light emitting device includes two electrodes and an organic emission layer disposed therebetween, and electrons injected from a cathode that is one of the two electrodes and holes injected from an anode are combined on the organic emission layer to form excitons, and the excitons discharge energy and emit light.

In a display device, a voltage applying unit for applying a voltage to the cathode from among the two electrodes of the organic light emitting device is disposed in a peripheral area adjacent to a display area in which a plurality of pixels are disposed.

SUMMARY

Embodiments provide a display device including a voltage applying unit which reduces or effectively prevents both an electrode layer on an organic insulator from peeling off by a processing gas and an increase in signal resistance.

Embodiments are not limited to the above-described features, and may be expanded in various ways in the range of the ideas and the areas of the invention.

An embodiment provides a display device including a substrate including a display area at which an image is displayed and a non-display area which is adjacent to the display area, and in the non-display area a common voltage transmitting line which is connected to the display area and through which a common voltage is provided to the display area, an organic insulating layer between the common voltage transmitting line and the substrate, a first opening which is in the common voltage transmitting line and exposes the organic insulating layer to outside the common voltage transmitting line and an auxiliary electrode which faces the organic insulating layer with the common voltage transmitting line therebetween, contacts the common voltage transmitting line at the first opening and covers the first opening.

The display device may further include a first electrode and a second electrode in the display area, and an organic emission layer between the first electrode and the second electrode. The common voltage transmitting line may be connected to the second electrode, and the auxiliary electrode may be in a same layer as the first electrode.

The display device may further include a first common voltage transmitting line below the organic insulating layer in the non-display area, the organic insulating layer may include a second opening overlapping the first common voltage transmitting line, and the common voltage transmitting line may be connected to the first common voltage transmitting line through the second opening.

The second electrode may extend to the non-display area, an end portion of the second electrode may overlap the second opening and may be connected to the common voltage transmitting line at a position overlapping the second opening, and the auxiliary electrode may not be directly connected to the second electrode.

The display device may further include a connecting member between the end portion of the second electrode and the common voltage transmitting line, and the connecting member may be in a same layer as the first electrode.

The display device may further include an insulating layer below the first common voltage transmitting line, and a plurality of recess portions may be in the insulating layer and contacting the first common voltage transmitting line from among surfaces of the insulating layer.

An embodiment provides a display device including a substrate including a display area and a non-display area which is adjacent to the display area, a transistor including a semiconductor layer, a gate electrode, an input electrode and an output electrode in the display area of the substrate, a first common voltage transmitting line in the non-display area of the substrate and in a same layer as the input electrode and the output electrode of the transistor, a first organic insulating layer on the transistor of the display area and the first common voltage transmitting line of the non-display area, a data line and a driving voltage line on the first organic insulating layer in the display area of the substrate, a second common voltage transmitting line on the first organic insulating layer in the non-display area of the substrate, connected to the first common voltage transmitting line and including an opening overlapping the first organic insulating layer, a second organic insulating layer on the data line and the driving voltage line, an organic light emitting element on the second organic insulating layer of the display area and including a first electrode, an organic emission layer and a second electrode, and an auxiliary electrode on the second common voltage transmitting line of the non-display area and completely covering the opening.

The second electrode may extend to the non-display area and may be connected to the second common voltage transmitting line, and the auxiliary electrode may not be directly connected to the second electrode.

The first common voltage transmitting line of the non-display area may be in a same layer as the input electrode and the output electrode of the display area.

The second common voltage transmitting line of the non-display area may be in a same layer as the data line and the driving voltage line of the display area.

The auxiliary electrode of the non-display area may be in a same layer as the first electrode of the display area.

The auxiliary electrode of the non-display area and the second electrode of the display area may be in a same layer as each other.

An embodiment provides a display device including a display area and a non-display area which is adjacent to the display area, the display area includes a semiconductor layer, a first insulating layer on the semiconductor layer, a gate electrode on the first insulating layer and overlapping the semiconductor layer, a second insulating layer on the gate electrode, a storage electrode on the second insulating layer, a third insulating layer on the storage electrode, an input electrode and an output electrode on the third insulating layer and connected to the semiconductor layer, a first organic insulating layer on the input electrode and the output electrode, a data line and a driving voltage line on the first organic insulating layer, a second organic insulating layer on the data line and the driving voltage line, a first electrode on the second organic insulating layer, a pixel defining layer including a pixel opening overlapping the first electrode, an emission layer in the pixel opening, and a second electrode on the pixel defining layer and the emission layer, the non-display area includes a first common voltage transmitting line on the third insulating layer, a second common voltage transmitting line on the first organic insulating layer on the first common voltage transmitting line, connected to the first common voltage transmitting line through a first opening and a second opening in the first organic insulating layer, and including a third opening overlapping the first organic insulating layer, an auxiliary electrode on the second common voltage transmitting line and completely covering the third opening, and a first spacer and a second spacer on the second common voltage transmitting line and having different heights, and the second electrode extends to the non-display area and is connected to the second common voltage transmitting line.

The third opening of the second common voltage transmitting line may be between the first spacer and the second spacer, and the third opening of the second common voltage transmitting line may be between a first portion of the second common voltage transmitting line in the first opening and a second portion of the second common voltage transmitting line in the second opening.

The first spacer may be on the first organic insulating layer of the non-display area, and may include a first layer in a same layer as the second organic insulating layer and a second layer on the first layer and in a same layer as the pixel defining layer, the second spacer may be on the first organic insulating layer of the non-display area, and may include a first layer in a same layer as the second organic insulating layer, a second layer on the first layer and in a same layer as the pixel defining layer, and a third layer on the second layer and including an organic material, and the inorganic encapsulation layer of the thin film encapsulation layer may overlap the first spacer and the second spacer, and the organic encapsulation layer of the thin film encapsulation layer may not overlap the first spacer and the second spacer.

The display device may further include a thin film encapsulation layer for covering the display area and the non-display area and including an inorganic encapsulation layer and an organic encapsulation layer. The inorganic encapsulation layer of the thin film encapsulation layer may overlap the first spacer and the second spacer, and the organic encapsulation layer of the thin film encapsulation layer may not overlap the first spacer and the second spacer.

According to the embodiments, the display device includes a common voltage applying unit for reducing or effectively preventing peeling off of a common electrode layer on an organic insulator by the processing gas generated by the organic insulator, which reduces or effectively prevents electrical signal resistance from increasing.

The effects of the invention are not limited to the above-described effects, and may be expanded in various ways in the range of the ideas and the areas of the invention.

BRIEF DESCRIPTION OF THE DRAWINGS

The above and other advantages and features of this disclosure will become more apparent by describing in further detail embodiments thereof with reference to the accompanying drawings, in which.

DETAILED DESCRIPTION

Figure 1:
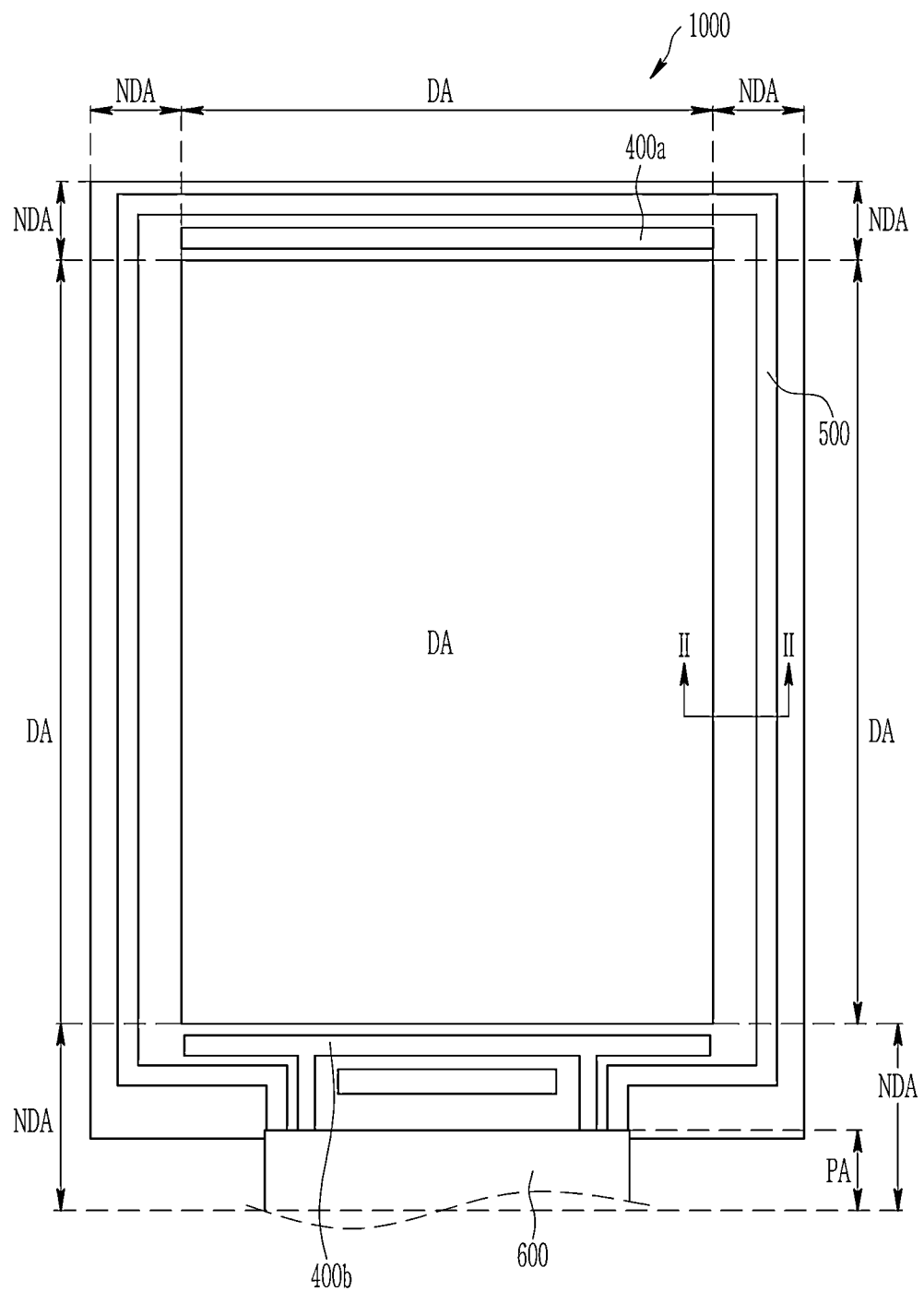
FIG. 1 shows a top plan view of an embodiment of a display device.

The invention will be described more fully hereinafter with reference to the accompanying drawings, in which embodiments of the invention are shown. As those skilled in the art would realize, the embodiments may be modified in various different ways, all without departing from the spirit or scope of the invention.

Parts that are irrelevant to the description will be omitted to clearly describe the invention, and the same elements will be designated by the same reference numerals throughout the specification.

The size and thickness of each configuration shown in the drawings are arbitrarily shown for better understanding and ease of description, but the invention is not limited thereto. In the drawings, the thickness of layers, films, panels, regions, etc., are exaggerated for clarity. The thicknesses of some layers and areas are exaggerated for convenience of explanation.

It will be understood that when an element such as a layer, film, region, or substrate is referred to as being related to another element such as being "on" another element, it can be directly on the other element or intervening elements may also be present. In contrast, when an element is referred to as being related to another element such as "directly on" another element, there are no intervening elements present. The word "on" or "above" means disposed on or below the object portion, and does not necessarily mean disposed on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

When it is described that a part is "connected (in contact with, coupled)" to another part, the part may be "directly connected" to the other element, may be "connected" to the other part through a third part, or may be connected to the other part physically or electrically, and they may be referred to by different titles depending on positions or functions, but they may be substantially integrated into one body.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
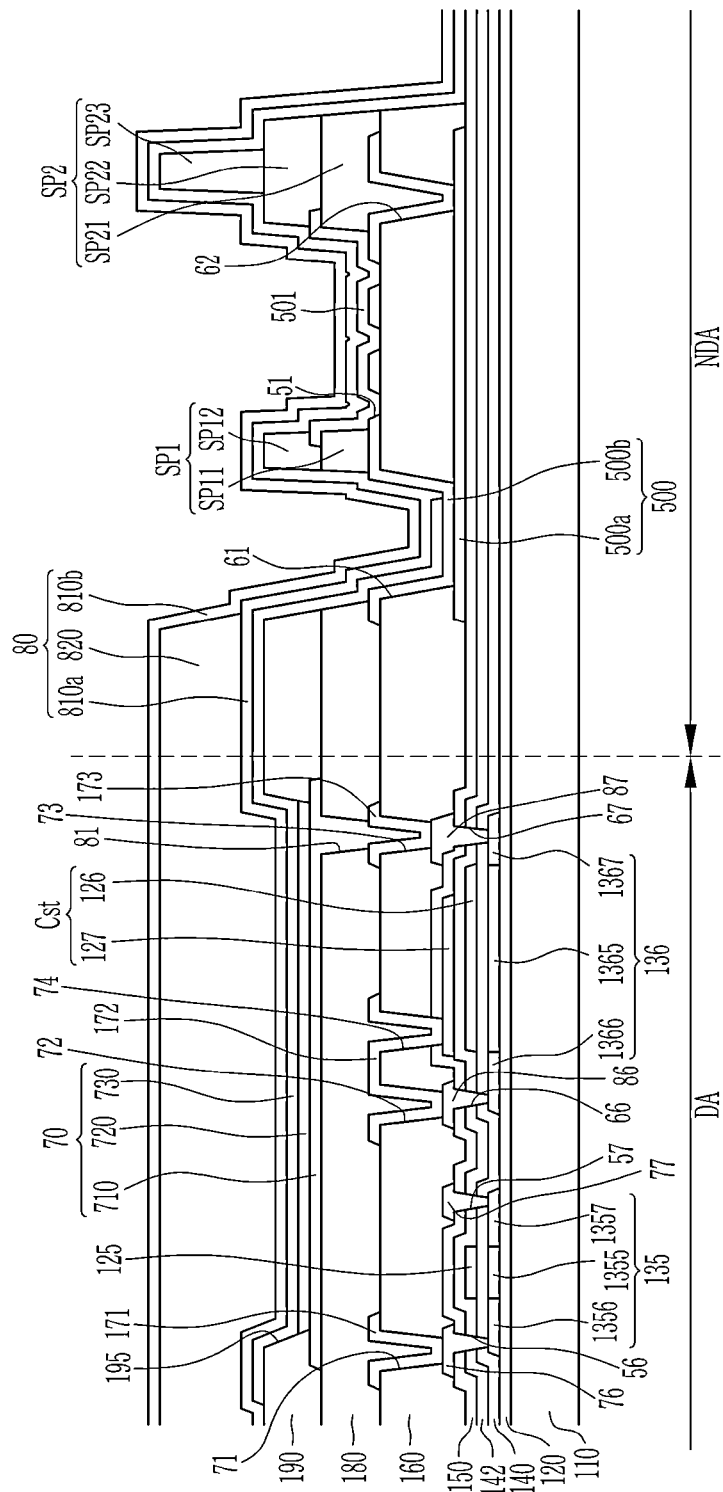
FIG. 2 shows a cross-sectional view with respect to line II-II of FIG. 1.

An embodiment of display device 1000 will now be described with reference to FIG. 1 and FIG. 2. FIG. 1 shows a top plan view of an embodiment of a display device 1000, and FIG. 2 shows a cross-sectional view with respect to line II-II of FIG. 1.

Referring to FIG. 1, the display device 1000 includes a display area DA for displaying images and a non-display area NDA disposed adjacent to and on an outer side of the display area DA. A plurality of pixels is in the display area DA, at which light is generated and/or emitted, an image is displayed, etc.

The non-display area NDA includes a driving area PA in which a driver 600 for transmitting an electrical signal to the display area DA is disposed.

Driving voltage transmitting lines 400*a* and 400*b* for transmitting driving voltages as electrical signals, and a common voltage transmitting line 500 for transmitting a common voltage as an electrical signal, are disposed in the non-display area NDA.

The driving voltage transmitting lines 400*a* and 400*b* include two portions that are separated from each other with the display area DA therebetween, and the common voltage transmitting line 500 extends along the non-display area NDA starting from the driver 600 and ending at the driver 600, to surround the display area A. However, the arrangement of the driving voltage transmitting lines 400*a* and 400*b* and the common voltage transmitting line 500 is not limited thereto.

An interlayer configuration of the display area DA and the non-display area NDA will now be described with reference to FIG. 2.

As described above, the display device 1000 includes a display area DA and a non-display area NDA.

The display device 1000 includes a substrate 110, and the substrate 110 may be flexible. Although not shown, the substrate 110 may include a plurality of insulation films overlapping each other, and may further include a barrier film disposed among the overlapping insulation films.

A buffer layer 120 is disposed on the substrate 110. The buffer layer 120 may include a single insulating layer such as a silicon nitride (SiNx) or a silicon oxide (SiOx), or a plurality of layers where the silicon nitride (SiNx) and the silicon oxide (SiOx) are stacked. The buffer layer 120 reduces or effectively prevents permeation of unnecessary components such as impurities or moisture.

A first semiconductor layer 135 (e.g., first semiconductor pattern) and a second semiconductor layer 136 (e.g., second semiconductor pattern) are disposed on the buffer layer 120 of the display area DA.

The first semiconductor layer 135 and the second semiconductor layer 136 may include polysilicon or an oxide semiconductor. In this instance, the oxide semiconductor may include an oxide based on titanium (Ti), hafnium (Hf), zirconium (Zr), aluminum (Al), tantalum (Ta), germanium (Ge), zinc (Zn), gallium (Ga), tin (Sn), or indium (In), or a complex oxide thereof.

The first semiconductor layer 135 includes a first channel region 1355, and a first source region 1356, and a first drain region 1357 disposed on respective sides of the first channel region 1355. In a similar manner, the second semiconductor layer 136 includes a second channel region 1365, and a second source region 1366, and a second drain region 1367 disposed on respective sides of the second channel region 1365. The first channel region 1355 of the first semiconductor layer 135 and the second channel region 1365 of the second semiconductor layer 136 may represent regions to which no impurity is doped, and the first source region 1356 and the first drain region 1357 of the first semiconductor layer 135 and the second source region 1366 and the second drain region 1367 of the second semiconductor layer 136 may represent regions to which conductive impurities are doped.

A first gate insulating film 140 is disposed on the first semiconductor layer 135 and the second semiconductor layer 136.

A first gate electrode 125 and a second gate electrode 126 are disposed on the first gate insulating film 140 of the display area DA.

The first gate electrode 125 overlaps or corresponds to the first channel region 1355, and the second gate electrode 126 overlaps or corresponds to the second channel region 1365.

A second gate insulating film 142 (e.g., second insulating layer) is disposed on the first gate electrode 125 and the second gate electrode 126.

The first gate insulating film 140 and the second gate insulating film 142 may be a single film including a silicon oxide (SiOx) or a silicon nitride (SiNx), or a multilayer on which they are stacked.

A storage electrode 127 is disposed on the second gate insulating film 142.

A first insulating layer 150 (e.g., a third insulating layer in order after the first gate insulating film 140 and the second gate insulating film 142) is disposed on the storage electrode 127. The first insulating layer 150 may be a single film including a silicon oxide (SiOx) or a silicon nitride (SiNx), or a multilayer on which they are stacked.

A first contact hole 56 overlapping the first source region 1356 of the first semiconductor layer 135, a second contact hole 57 overlapping the first drain region 1357 of the first semiconductor layer 135, a third contact hole 66 overlapping the second source region 1366 of the second semiconductor layer 136, and a fourth contact hole 67 overlapping the second drain region 1367 of the second semiconductor layer 136 are provided or formed in the first gate insulating film 140, the second gate insulating film 142 and the first insulating layer 150.

A first input electrode 76, a first output electrode 77, a second input electrode 86 and a second output electrode 87 are disposed on the first insulating layer 150 of the display area DA. A first common voltage transmitting line 500a (e.g., first common voltage transmitting layer) of the common voltage transmitting line 500 is disposed on the first insulating layer 150 of the non-display area NDA.

The first common voltage transmitting line 500a of the common voltage transmitting line 500 may be simultaneously formed with the first input electrode 76, the first output electrode 77, the second input electrode 86 and the second output electrode 87 of the display area DA. That is, the first common voltage transmitting line 500a may be in a same layer as the first input electrode 76 of the display area DA, the first output electrode 77, the second input electrode 86 and the second output electrode 87. As being "in a same layer," elements are respective portions or respective patterns of a same material layer.

The first input electrode 76 is connected to the first source region 1356 of the first semiconductor layer 135 through the first contact hole 56, the first output electrode 77 is connected to the first drain region 1357 of the first semiconductor layer 135 through the second contact hole 57, the second input electrode 86 is connected to the second source region 1366 of the second semiconductor layer 136 through the third contact hole 66, and the second output electrode 87 is connected to the second drain region 1367 of the second semiconductor layer 136 through the fourth contact hole 67. Although not shown, the first output electrode 77 may be connected to the second gate electrode 126.

A first interlayer insulating film 160 (e.g., first organic insulating layer) is disposed on the first input electrode 76, the first output electrode 77, the second input electrode 86 and the second output electrode 87. The first interlayer insulating film 160 may include an organic material.

A fifth contact hole 71 overlapping the first input electrode 76, a sixth contact hole 72 overlapping the second input electrode 86, and a seventh contact hole 73 overlapping the second output electrode 87 are provided or formed in the first interlayer insulating film 160 of the display area DA. An eighth contact hole 74 overlapping the storage electrode 127 is provided or formed in the first interlayer insulating film 160 and the first insulating layer 150. A first opening 61 and a second opening 62 overlapping the first common voltage transmitting line 500a of the common voltage transmitting line 500 are provided or formed in the first interlayer insulating film 160 of the non-display area NDA.

A data line 171, a driving voltage line 172 and an output member 173 are disposed on the first interlayer insulating film 160 of the display area DA. A second common voltage transmitting line 500b (e.g., second common voltage transmitting layer) of the common voltage transmitting line 500 is disposed on the first interlayer insulating film 160 of the non-display area NDA.

The data line 171 of the display area DA is connected to the first input electrode 76 through the fifth contact hole 71, and the driving voltage line 172 is connected to the second input electrode 86 through the sixth contact hole 72 and is connected to the storage electrode 127 through the eighth contact hole 74. The output member 173 is connected to the second output electrode 87 through the seventh contact hole 73.

The second common voltage transmitting line 500b of the common voltage transmitting line 500 of the non-display area NDA may be simultaneously formed with the data line 171, the driving voltage line 172 and the output member 173 of the display area DA. That is, the second common voltage transmitting line 500b may be in a same layer as the data line 171, the driving voltage line 172 and the output member 173.

The first common voltage transmitting line 500a disposed below the first interlayer insulating film 160 is connected to the second common voltage transmitting line 500b disposed above the first interlayer insulating film 160 at or through the first opening 61 and the second opening 62 of the first interlayer insulating film 160. The first opening 61 and the second opening 62 of the first interlayer insulating film 160 overlaps the first common voltage transmitting line 500a. The second common voltage transmitting line 500b which is above the first interlayer insulating film 160 extends into the first opening 61 and the second opening 62 to contact the first common voltage transmitting line 500a at the first opening 61 and the second opening 62.

As described, an electrical signal resistance of the common voltage transmitting line 500 may be reduced by providing or forming the common voltage transmitting line 500 as a double-layer structure including the first common voltage transmitting line 500a and the second common voltage transmitting line 500b in different layers from each other and in contact with each other.

Regarding the common voltage transmitting line 500, the second common voltage transmitting line 500b disposed on the first interlayer insulating film 160 including an organic material includes or defines a third opening 51 provided in plural including a plurality of third openings 51 overlapping a portion of the first interlayer insulating film 160 which is in the non-display area NDA. Processing gas that may be generated by the first interlayer insulating film 160 including an organic material may be discharged to the outside through the plurality of third openings 51 of the second common voltage transmitting line 500b. By these third openings 51, peeling off of the second common voltage transmitting line 500b from the first interlayer insulating film 160 by the processing gas may be reduced or effectively prevented.

A second interlayer insulating film 180 (e.g., second organic insulating layer) is disposed on the data line 171, the driving voltage line 172 and the output member 173 of the display area DA. A first spacer portion SP11 of a first spacer SP1 and a second spacer portion SP21 of a second spacer SP2 are disposed on the second common voltage transmitting line 500b of the non-display area NDA.

The second interlayer insulating film 180, the first spacer portion SP11 and the second spacer SP2 may include organic materials, and may be in a same layer as each other.

A ninth contact hole 81 overlapping the output member 173 is disposed in the second interlayer insulating film 180.

A pixel electrode 710 (e.g., first electrode) is disposed on the second interlayer insulating film 180 in the display area DA. The pixel electrode 710 is connected to the output member 173 through the ninth contact hole 81 in the second interlayer insulating film 180.

The pixel electrode 710 may be an anode of an organic light emitting element 70.

A first auxiliary electrode 501 covering a plurality of third openings 51 of the second common voltage transmitting line 500b is disposed on the second common voltage transmitting line 500b disposed on the second interlayer insulating film 180 in the non-display area NDA. The first auxiliary electrode 501 is disposed on the second common voltage transmitting line 500b and covers a plurality of third openings 51 of the second common voltage transmitting line 500b to thus connect portions of the second common voltage transmitting line 500b which are spaced apart from each other by the plurality of third openings 51, and reduce or effectively prevent increase of electrical signal resistance of the second common voltage transmitting line 500b.

The pixel electrode 710 and the first auxiliary electrode 501 may be in a same layer as each other.

A pixel defining layer 190 is disposed on the pixel electrode 710 of the display area DA. The pixel defining layer 190 includes or defines a pixel opening 195 overlapping the pixel electrode 710. The pixel opening 195 of the pixel defining layer 190 is disposed in the display area DA, and the pixel defining layer 190 is mainly disposed in the display area DA.

A third spacer portion SP12 of the first spacer SP1 and a fourth spacer portion SP22 of the second spacer SP2 are disposed in the non-display area NDA.

The pixel defining layer 190, the third spacer portion SP12 and the fourth spacer portion SP22 may be in a same layer as each other.

The pixel defining layer 190 may include a resin such as a polyacrylate or a polyimide and a silica-based inorganic material. The pixel defining layer 190 may include a black color pigment or/and a dye to absorb external light, thereby reducing reflectance of the external light and increasing a contrast ratio of the display device 1000.

An organic emission layer 720 is disposed in the pixel opening 195 of the pixel defining layer 190 disposed in the display area DA.

The organic emission layer 720 may be a multi-layered structure including at least one of an emission layer, a hole injection layer ("HIL"), a hole transporting layer ("HTL"), an electron transporting layer ("ETL") and an electron injection layer ("EIL"). When the organic emission layer 720 includes all of the aforementioned layers, the hole injection layer may be disposed on the pixel electrode 710 that is an anode of the organic light emitting element 70, and the hole transporting layer, the emission layer, the electron transporting layer and the electron injection layer may be sequentially stacked thereon.

A common electrode 730 (e.g., second electrode) is disposed on the pixel defining layer 190 and the organic emission layer 720. The common electrode 730 becomes a cathode of the organic light emitting element 70. Therefore, the pixel electrode 710, the organic emission layer 720 and the common electrode 730 together define an organic light emitting element 70.

The common electrode 730 is disposed on an entirety of the display area DA, and extends from the display area DA to the non-display area NDA to overlap the first opening 61 of the first interlayer insulating film 160. At the first opening 61, the common electrode 730 contacts the common voltage transmitting line 500 to receive the common voltage transmitted through the common voltage transmitting line 500.

The first semiconductor layer 135, the first gate electrode 125, the first input electrode 76 and the first output electrode 77 configure a first transistor, and the second semiconductor layer 136, the second gate electrode 126, the second input electrode 86 and the second output electrode 87 configure a second transistor. The first transistor may be a switching transistor, and the second transistor may be a driving transistor.

When an electrical signal such as a gate-on signal is applied to the first gate electrode 125 and an electrical signal such as a data signal is input to the first input electrode 76 from the data line 171, the data signal is transmitted to the first output electrode 77 and is then transmitted to the second gate electrode 126. The driving voltage applied to the driving voltage line 172 is applied to the second input electrode 86, and a corresponding electrical driving current flows to the second output electrode 87 through the second channel region 1365 of the second semiconductor layer 136. The voltage applied to the second output electrode 87 is transmitted to the pixel electrode 710 through the output member 173, and the common voltage is applied to the common electrode 730 through the common voltage transmitting line 500. The pixel electrode 710 is an anode that is a hole injecting electrode, and the common electrode 730 is a cathode that is an electron injecting electrode. Holes and electrons are injected into the organic emission layer 720 from the pixel electrode 710 and the common electrode 730, and when excitons that are a combination of the injected holes and electrons transit to the ground state from the excited state, light emits.

A capacitor Cst is connected between the second gate electrode 126 and the storage electrode 127. The capacitor Cst charges the data signal applied to the second gate electrode 126 and maintains the same.

A fifth spacer portion SP23 of a second spacer SP2 is disposed in the non-display area NDA. The fifth spacer portion SP23 may include an organic material.

As shown, a first spacer SP1 and a second spacer SP2 are disposed on an external side of the non-display area NDA, and the second spacer SP2 is further away from the display area DA than the first spacer SP1. That is, the second spacer SP2 is disposed closer to an edge of the display device 1000 than the first spacer SP1.

The first spacer SP1 and the second spacer SP2 are disposed on the first interlayer insulating film 160, the first spacer SP1 may be provided or formed as a same layer as the second interlayer insulating film 180 and the pixel defining layer 190, and the second spacer SP2 may be provided by respective patterns of the second interlayer insulating film 180, the pixel defining layer 190 and an additional insulating layer. By this, a top portion of the second spacer SP2 is higher than a top portion of the first spacer SP1. That is, each of the first spacer SP1 and the second spacer SP2 includes a top surface which is furthest from the substrate 110, and the top surface of the second spacer SP2 is further from the substrate 110 than the top surface of the first spacer SP1.

An encapsulation layer 80 is disposed on the common electrode 730. The encapsulation layer 80 may be provided or formed by stacking at least one inorganic layer and at least one organic layer, and the inorganic layer or the organic layer may be plural, respectively.

In the embodiment, the encapsulation layer 80 includes a first inorganic encapsulation layer 810a and a second inorganic encapsulation layer 810b facing each other, and an organic encapsulation layer 820 disposed between the first inorganic encapsulation layer 810a and the second inorganic encapsulation layer 810b.

The first inorganic encapsulation layer 810a and the second inorganic encapsulation layer 810b are provided or formed on the entirety of the substrate 110 and are disposed on the first spacer SP1 and the second spacer SP2. The organic encapsulation layer 820 in the display area DA extends from the display area DA to the non-display area NDA and terminates at a location between the display area DA and the first spacer SP1. That is, the organic encapsulation layer 820 is not disposed on the outer side of the first spacer SP1 and the second spacer SP2 from among positions within the non-display area NDA, where the outer side is closer to the edge of the display device 1000 than an inner side.

When the organic encapsulation layer 820 is provided or formed, the first spacer SP1 and the second spacer SP2 may function as a dam for reducing or effectively preventing overflowing of an organic material for forming the organic encapsulation layer 820 to the outer sides of the first spacer SP1 and the second spacer SP2. Thus, the organic encapsulation layer 820 may be excluded from the outer sides of the first spacer SP1 and the second spacer SP2.

The first opening 61 of the first interlayer insulating film 160 in which the first common voltage transmitting line 500a is connected to the second common voltage transmitting line 500b is disposed closer to the display area DA than the first spacer SP1. That is, the first opening 61, the first spacer SP1 and the second spacer SP2 are in order along the substrate 110, in a direction from the display area DA to the edge of the display device 1000.

A plurality of third openings 51 of the second common voltage transmitting line 500b are disposed between the first spacer SP1 and the second spacer SP2. The second common voltage transmitting line 500b includes two end portions respectively connected to the first common voltage transmitting line 500a through the first opening 61 and the second opening 62, and middle portions disposed between the two end portions. A plurality of third openings 51 of the second common voltage transmitting line 500b are disposed between the two end portions of the second common voltage transmitting line 500b connected to the first common voltage transmitting line 500a through the first opening 61 and the second opening 62. The plurality of third openings 51 are defined by the two end portions and the middle portions of the second common voltage transmitting line 500b.

The second opening 62 of the first interlayer insulating film 160 in which the first common voltage transmitting line 500a is connected to the second common voltage transmitting line 500b may overlap or correspond to the second spacer SP2.

The first auxiliary electrode 501 is not directly connected to the common electrode 730 of the display area DA. Instead, the first auxiliary electrode 501 is connected to the common electrode 730 of the display area DA via the common voltage transmitting line 500. That is, the auxiliary electrode 501 which contacts the common voltage transmitting line 500 at the third opening 51 is connected to the second electrode (e.g., common electrode 730) by contact at the first opening OP1 of the second electrode with the common voltage transmitting line 500.

The configuration of the pixel disposed in the display area DA of the display device shown in FIG. 2 is only an example, and the pixel configuration of the display device 1000 is not limited to the configuration described with reference to FIG. 2. The signal line and the organic light emitting element 70 may have various configurations in the range in which a person skilled in the art may easily modify. FIG. 2 shows a display device 1000 including two thin film transistors ("TFTs") and one capacitor, but the invention is not limited thereto. Hence, the display device 1000 is not limited to a number of thin film transistors, capacitors and wires (e.g., conductive line and/or signal line).

Figure 3:
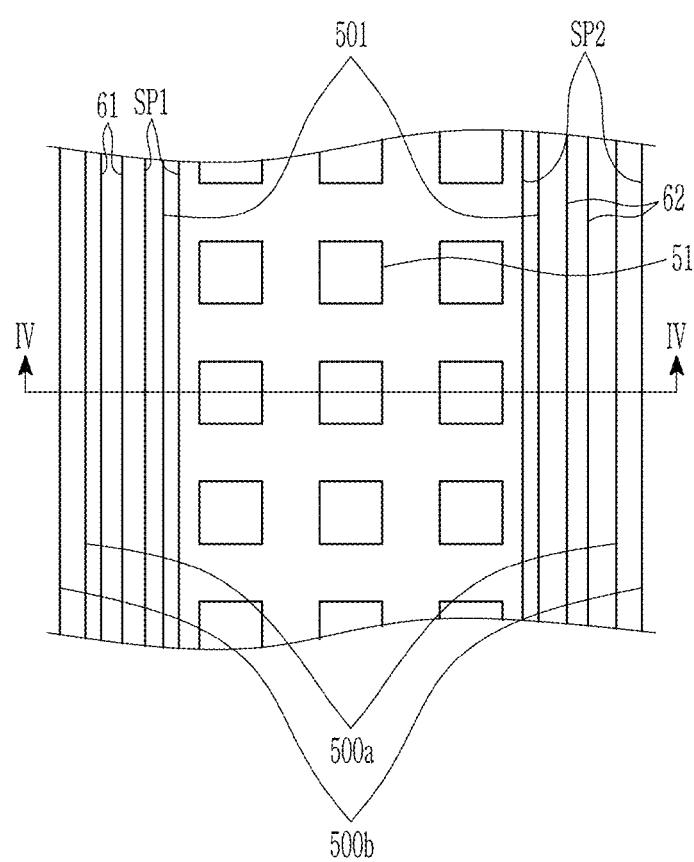
FIG. 3 shows a top plan view of an embodiment of a common voltage applying unit of a display device.

A common voltage applying unit of a display device 1000 described with reference to FIG. 1 and FIG. 2 will now be described in detail with reference to FIG. 3 to FIG. 5A and FIG. 5B. FIG. 3 shows a top plan view of an embodiment of a common voltage applying unit of a display device 1000, FIG. 4 shows a cross-sectional view with respect to line IV-IV of FIG. 3, and FIG. 5 and FIG. 5B show photographs taken by an electron microscope of a comparative display device according to a comparative example.

Figure 4:
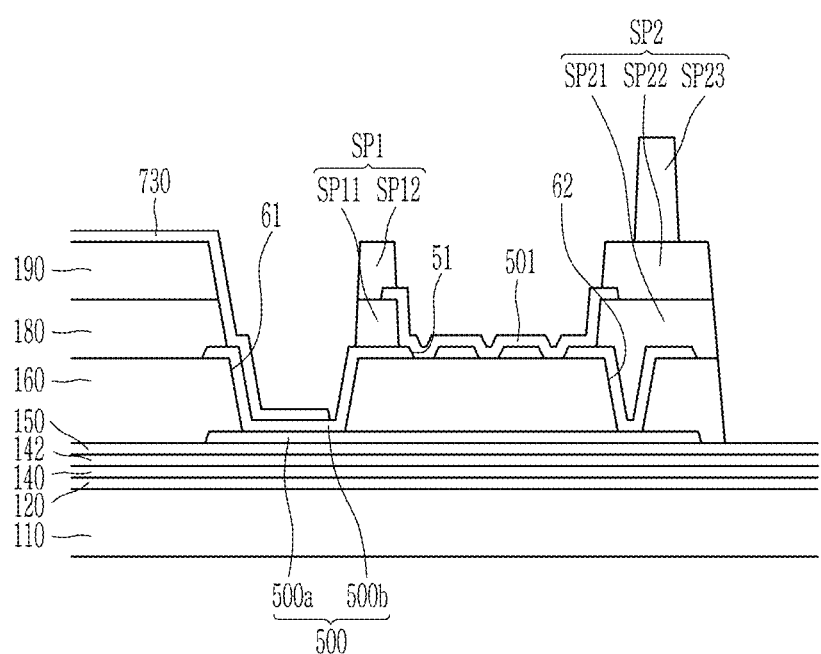
FIG. 4 shows a cross-sectional view of FIG. 3.
Figure 5A:
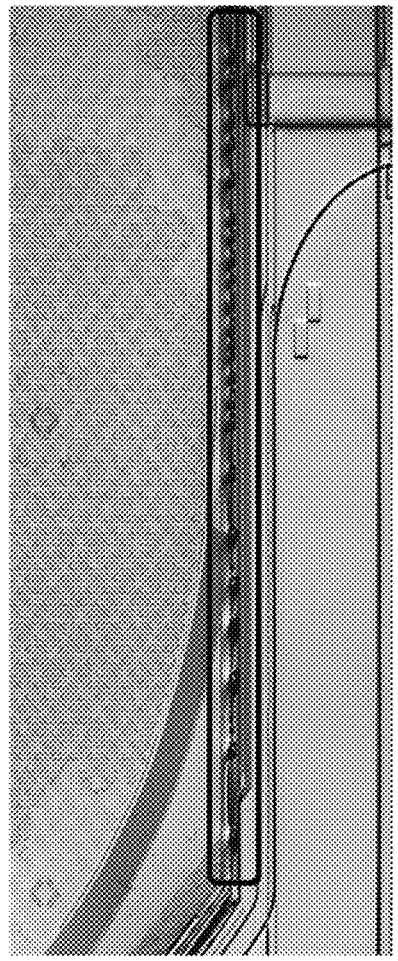
FIG. 5A and FIG. 5B show photographs taken by an electron microscope of a comparative display device.
Figure 5B:
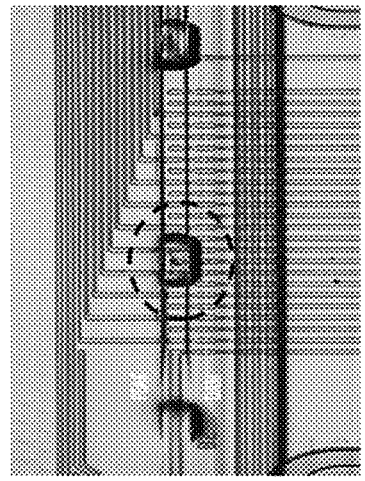

Referring to FIG. 3 and FIG. 4, a buffer layer 120, a first gate insulating film 140, a second gate insulating film 142 and a first insulating layer 150 that are a plurality of insulating layers including inorganic materials are disposed on the substrate 110 of the non-display area NDA of the display device 1000. A first common voltage transmitting line 500a of the common voltage transmitting line 500 is disposed on the first insulating layer 150. A first interlayer insulating film 160 including an organic material is disposed on the first common voltage transmitting line 500a. A second common voltage transmitting line 500b of the common voltage transmitting line 500 is disposed on the first interlayer insulating film 160. The first common voltage transmitting line 500a may be simultaneously provided or formed with the first input electrode 76, the first output electrode 77, the second input electrode 86 and the second output electrode 87 of the display area DA. The second common voltage transmitting line 500b of the common voltage transmitting line 500 may be simultaneously provided or formed with the data line 171, the driving voltage line 172 and the output member 173 of the display area DA.

The first common voltage transmitting line 500a overlaps the second common voltage transmitting line 500b with the first interlayer insulating film 160 including an organic material therebetween. The first common voltage transmitting line 500a and the second common voltage transmitting line 500b which face each other are connected to each other at both of the first opening 61 and the second opening 62 in the first interlayer insulating film 160. The first opening 61 and the second opening 62 are spaced apart from each other along the substrate 110 with the first spacer SP1 therebetween. As described above, the common voltage transmitting line 500 is provided or formed to be a double-layered structure including the first common voltage transmitting line 500a and the second common voltage transmitting line 500b, thereby reducing electrical signal resistance of the common voltage transmitting line 500.

The second common voltage transmitting line 500b includes or defines a plurality of third openings 51. A plurality of third openings 51 function as a passage for discharging the processing gas generated by the first interlayer insulating film 160 including an organic material to the outside during a process in manufacturing a display device 1000. By this, peeling off of the second common voltage transmitting line 500b from the first interlayer insulating film 160 by the processing gas is reduced or effectively prevented.

FIG. 5A and FIG. 5B are photographs for showing a state in which the second common voltage transmitting line 500b is peeled off by the processing gas in a comparative display device according to a comparative example in which the second common voltage transmitting line 500b does not have a plurality of third openings 51, different from one or more embodiment of the display device 1000. In FIG. 5B shows a photograph of an enlarged part of FIG. 5A, and portions that are marked by an oval of FIG. 5A and a circle of FIG. 5B indicate that the common voltage line is peeled off. As described above, when the processing gas is not outgassed to outside the first interlayer insulating film 160, the second common voltage transmitting line 500b disposed on the first interlayer insulating film 160 including an organic material is peeled off by the processing gas, and the common voltage transmitting line 500 may be short-circuited.

As shown in FIG. 3, in a plan view, a plurality of third openings 51 of the second common voltage transmitting line 500b may be separated from each other along a first direction (e.g., horizontal in FIG. 3). In the plan view, the plurality of third openings 51 may be regularly disposed along a plurality of columns extended along a second direction crossing the first direction (e.g., vertical in FIG. 3). The plurality of columns may be arranged along the first direction. A thickness direction of the display device 1000 (e.g., vertical in FIG. 4) is taken along a third direction crossing each of the first direction and the second direction.

Shapes of the plurality of third openings 51 in a plan view may be a polygon such as a quadrangle. However, dispositions and planar shapes of a plurality of third openings 51 are not limited thereto, and a plurality of third openings 51 may be disposed in only a portion of the second common voltage transmitting line 500b, and may have circular or oval shapes in a plan view.

A first spacer portion SP11 and a second spacer portion SP21 of a first spacer SP1 and a second spacer SP2, respectively, are disposed on the second common voltage transmitting line 500b. The first spacer portion SP11 and the second spacer portion SP21 may be simultaneously provided or formed with the second interlayer insulating film 180 of the display area DA.

The first auxiliary electrode 501 is disposed on the second common voltage transmitting line 500b so as to completely cover a plurality of third openings 51 of the second common voltage transmitting line 500b. An end portion 501a of the first auxiliary electrode 501 at opposing ends thereof may be respectively disposed on the first spacer portion SP11 and the second spacer portion SP21, and a connecting portion of the first auxiliary electrode 501 which connects the opposing ends to each other may be disposed on lateral sides of the first spacer portion SP11 and the second spacer portion SP21. The first auxiliary electrode 501 may be simultaneously provided or formed with the pixel electrode 710 of the display area DA.

Within the non-display area NDA, the first opening 61 of the first interlayer insulating film 160 in which the first common voltage transmitting line 500a is connected to the second common voltage transmitting line 500b is disposed nearer the display area DA than the first spacer SP1.

A plurality of third openings 51 of the second common voltage transmitting line 500b are disposed between the first spacer SP1 and the second spacer SP2. A plurality of third openings 51 of the second common voltage transmitting line 500b are disposed between two end portions of the second common voltage transmitting line 500b at which the second common voltage transmitting line 500b is connected to the first common voltage transmitting line 500a through the first opening 61 and the second opening 62, respectively. The first auxiliary electrode 501 is not directly connected to the common electrode 730 of the display area DA. That is, the auxiliary electrode 501 which contacts the second common voltage transmitting line 500b at the opening (e.g., third opening 51) of the non-display area NDA is connected to the second electrode (e.g., common electrode 730) by connection within the non-display area NDA of the second electrode with the second common voltage transmitting line 500b.

The second opening 62 of the first interlayer insulating film 160 in which the first common voltage transmitting line 500a is connected to the second common voltage transmitting line 500b may overlap the second spacer SP2.

Electrical signal resistance at the second common voltage transmitting line 500b may increase by a plurality of third openings 51 of the second common voltage transmitting line 500b. However, since the first auxiliary electrode 501 is disposed on the second common voltage transmitting line 500b so as to cover a plurality of third openings 51 of the second common voltage transmitting line 500b, the increase of the electrical signal resistance at the second common voltage transmitting line 500b may be reduced or effectively prevented by connecting solid portions of the second common voltage transmitting line 500b spaced apart from each other by the plurality of third openings 51.

According to one or more embodiment of the display device 1000, the common voltage transmitting line 500 common voltage applying unit disposed in the non-display area NDA is provided or formed to be a double-layered structure including the first common voltage transmitting line 500a and the second common voltage transmitting line 500b respectively disposed below and above the first interlayer insulating film 160 including an organic material. The first common voltage transmitting line 500a and the second common voltage transmitting line 500b which face each other with the first interlayer insulating film 160 therebetween are connected to each other by contact of the first common voltage transmitting line 500a and the second common voltage transmitting line 500b at the first opening 61 and the second opening 62 in the first interlayer insulating film 160, thereby reducing electrical signal resistance of the common voltage transmitting line 500 and accordingly reducing power consumption.

The second common voltage transmitting line 500b disposed on the first interlayer insulating film 160 including an organic material includes a plurality of third openings 51 to thus outgas the processing gas generated by the organic material during the manufacturing process to outside the second common voltage transmitting line 500b, and reducing or effectively prevent peeling off of the second common voltage transmitting line 500b from the first interlayer insulating film 160 by the processing gas. The first auxiliary electrode 501 is disposed on the second common voltage transmitting line 500b so as to cover a plurality of third openings 51 of the second common voltage transmitting line 500b and connect solid portions thereof to each other, thereby reducing or effectively preventing the electrical signal resistance of the second common voltage transmitting line 500b from increasing by the plurality of third openings 51.

Figure 6:
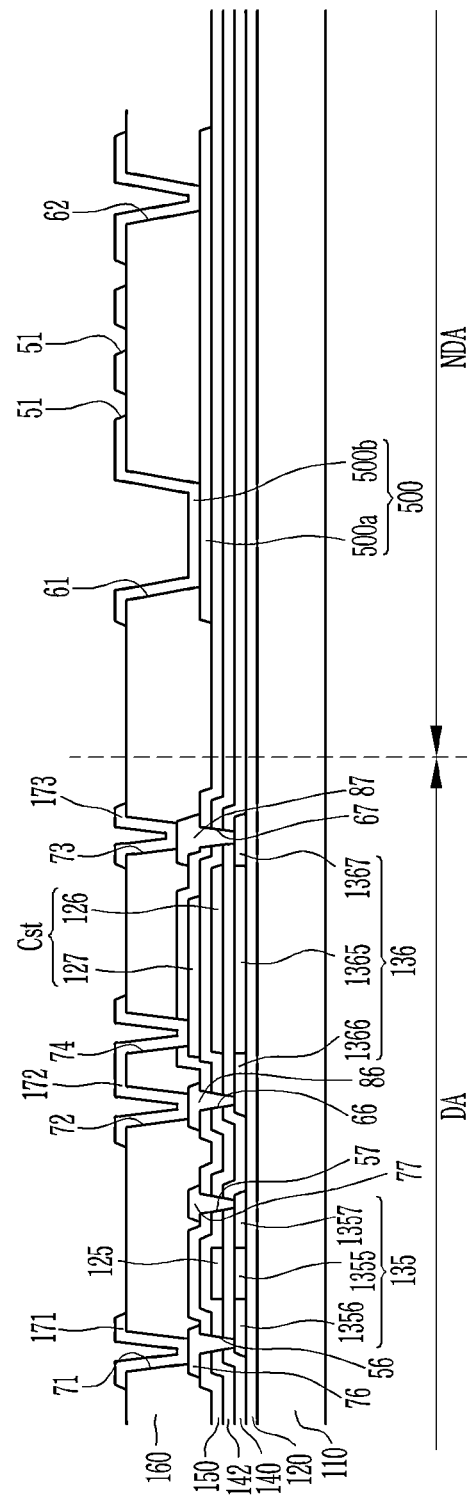
FIG. 6 to FIG. 8 show cross-sectional views of an embodiment of a method for providing the display device of FIG. 2.
Figure 7:
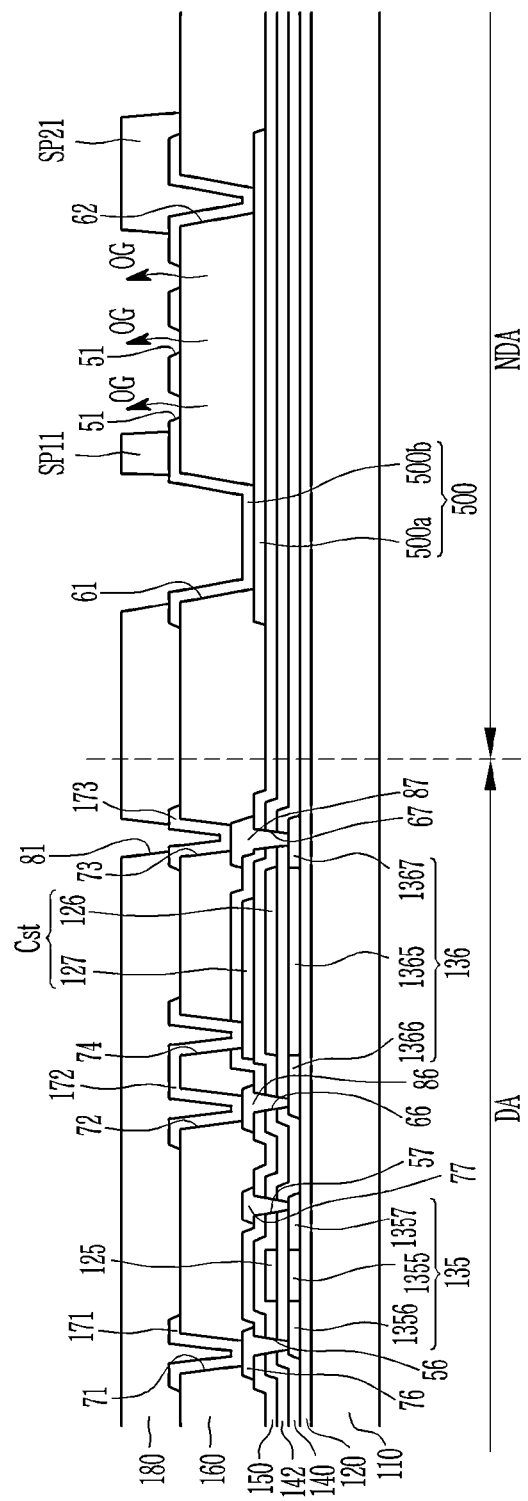
Figure 8:
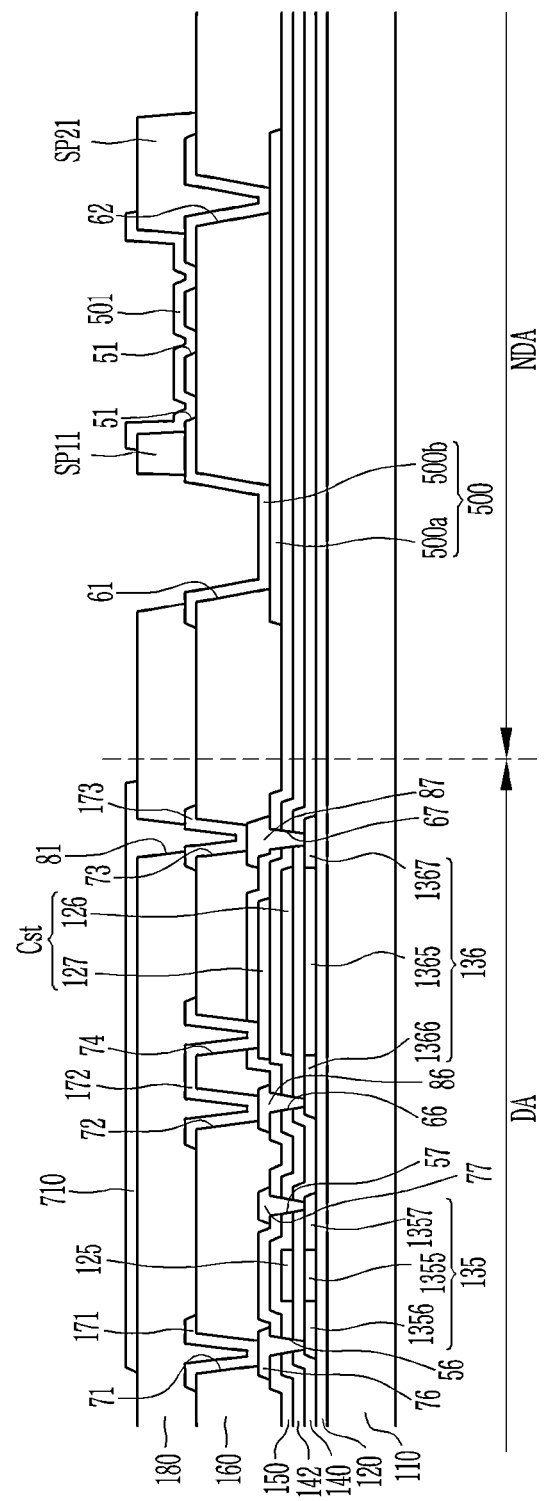

An embodiment of a method for manufacturing a display device 1000 will now be described with reference to FIG. 2 together with FIG. 6 to FIG. 8. FIG. 6 to FIG. 8 show cross-sectional views of an embodiment of a method for manufacturing a display device 1000.

Referring to FIG. 2 and FIG. 6, a buffer layer 120 is stacked on a substrate 110, a first semiconductor layer 135 and a second semiconductor layer 136 are provided or formed on the buffer layer 120 such as by a first photolithography process, a first gate insulating film 140 is stacked on the first semiconductor layer 135 and the second semiconductor layer 136, a first gate electrode 125 and a second gate electrode 126 are provided or formed on the first gate insulating film 140 such as by a second photolithography process, and a first source region 135S and a first drain region 135T are provided or formed on respective sides of a first channel region 135S and a second source region 136S and a second drain region 136T are provided or formed on respective sides of a second channel region 136S such as by applying an impurity to the first semiconductor layer 135 and the second semiconductor layer 136 by use of the first gate electrode 125 and the second gate electrode 126 as masks.

A second gate insulating film 142 is stacked on the first gate electrode 125 and the second gate electrode 126, a storage electrode 127 is provided or formed such as by a third photolithography process, a first insulating layer 150 is stacked on the storage electrode 127, a first contact hole 56, a second contact hole 57, a third contact hole 66 and a fourth contact hole 67 are formed in the first gate insulating film 140, the second gate insulating film 142 and the first insulating layer 150 such as by a fourth photolithography process, and a first common voltage transmitting line 500a of the common voltage transmitting line 500 is provided or formed together with the first input electrode 76, the first output electrode 77, the second input electrode 86 and the second output electrode 87 such as by a fifth photolithography process. That is, the first common voltage transmitting line 500a, the first input electrode 76, the first output electrode 77, the second input electrode 86 and the second output electrode 87 are respective patterns of a same conductive material layer.

A first interlayer insulating film 160 including an organic material is stacked, and a first opening 61 and a second opening 62 are provided or formed in the first interlayer insulating film 160 together with the fifth contact hole 71, the sixth contact hole 72, the seventh contact hole 73 and the eighth contact hole 74 such as by a sixth photolithography process.

By a seventh photolithography process, a second common voltage transmitting line 500b defining a plurality of third openings 51 therein, together with the data line 171, the driving voltage line 172 and the output member 173, are disposed on the first interlayer insulating film 160. That is, the second common voltage transmitting line 500b, the data line 171, the driving voltage line 172 and the output member 173 are respective patterns of a same conductive material layer.

As shown in FIG. 7, the second interlayer insulating film 180 is stacked, a ninth contact hole 81 is provided or formed in the second interlayer insulating film 180 such as by an eighth photolithography process, and a first spacer portion SP11 and a second spacer portion SP21 are provided. That is, the second interlayer insulating film 180, the first spacer portion SP11 and the second spacer portion SP21 are respective patterns of a same insulating material layer.

In this instance, the second interlayer insulating film 180 includes an organic material, formation of the second interlayer insulating film 180 including the organic material includes a curing process such as baking, and processing gas is generated by the first interlayer insulating film 160 and the second interlayer insulating film 180 including an organic material during the curing process. Particularly, the processing gas generated by the first interlayer insulating film 160 disposed below the second common voltage transmitting line 500b may be outgassed OG to outside the first interlayer insulating film 160 and the second interlayer insulating film 180 through the third openings 51 of the second common voltage transmitting line 500b.

As described, the processing gas generated by the first interlayer insulating film 160 is outgassed OG through the third opening 51 of the second common voltage transmitting line 500b, so peeling off of the second common voltage transmitting line 500b disposed on the first interlayer insulating film 160 including an organic material is reduced or effectively prevented.

As shown in FIG. 8, a pixel electrode 710 and a first auxiliary electrode 501 are provided or formed such as by a ninth photolithography process.

Referring again to FIG. 2, a pixel defining layer 190, a third spacer portion SP12, a fourth spacer portion SP22 and a fifth spacer portion SP23 are provided or formed such as by a tenth photolithography process, on the stacked structure of FIG. 8. In an embodiment, the fifth spacer portion SP23 may be provided formed by another photolithography process. The display device 1000 shown in FIG. 2 is provided or formed by forming an organic emission layer 720, a common electrode 730 and an encapsulation layer 80.

According to one or more embodiment of the method for manufacturing a display device 1000, during a curing process of an insulating layer, processing gas generated by the first interlayer insulating film 160 disposed below the second common voltage transmitting line 500b may be outgassed OG through the third openings 51 of the second common voltage transmitting line 500b. Therefore, different from the comparative display device shown in FIGS. 5A and 5B, peeling off of the second common voltage transmitting line 500b from the first interlayer insulating film 160 by the processing gas may be reduced or effectively prevented.

Figure 9:
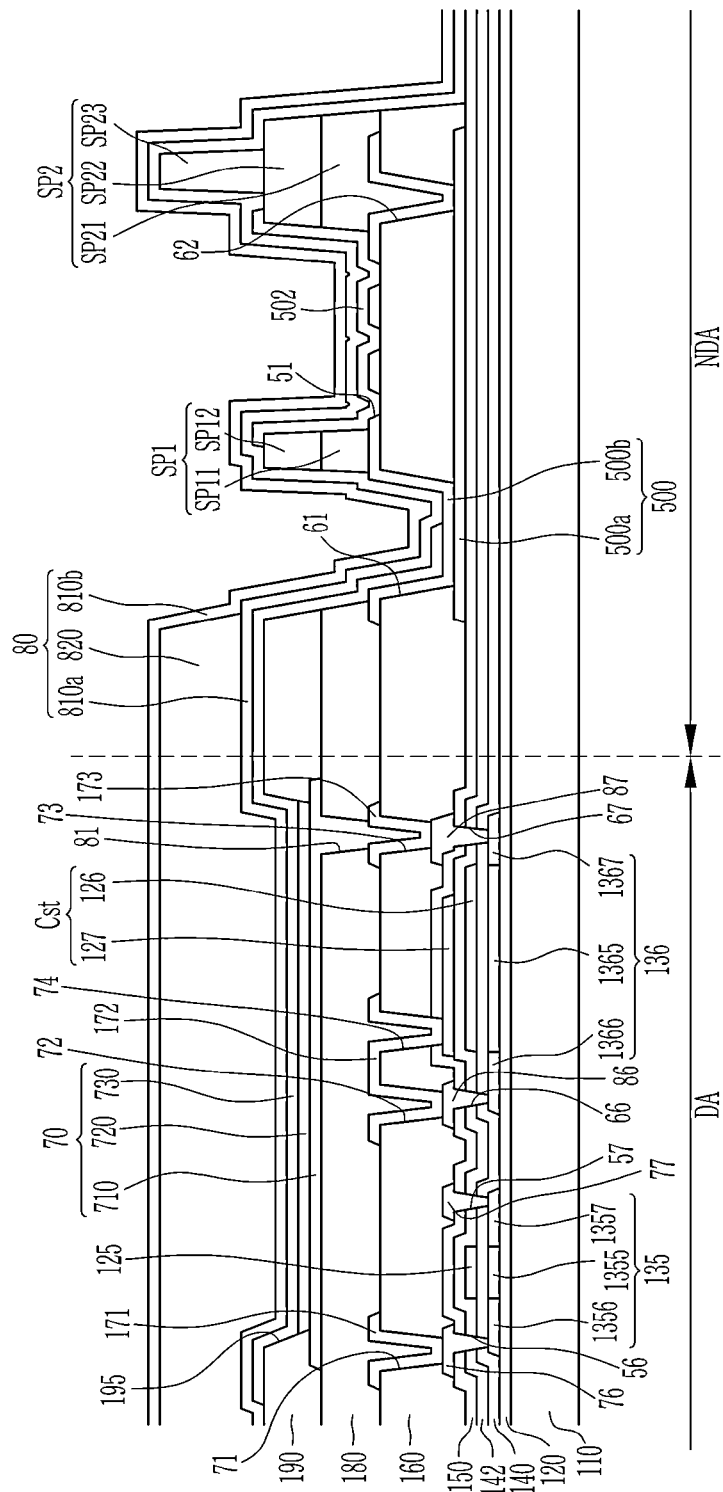
FIG. 9 shows a cross-sectional view of an embodiment of a display device.

An embodiment of a display device 1000 will now be described with reference to FIG. 9. FIG. 9 shows a cross-sectional view of a display device 1000.

Referring to FIG. 9, the display device 1000 is similar to the display device 1000 described with reference to FIG. 1, FIG. 2, FIG. 3 and FIG. 4. No detailed descriptions on the same constituent elements will be provided.

However, regarding the display device 1000 in FIG. 9, differing from the display device 1000 in FIGS. 1 to 4, a second auxiliary electrode 502 is disposed on the second common voltage transmitting line 500b of the non-display area NDA. The second auxiliary electrode 502 may be disposed on the second common voltage transmitting line 500b to cover a plurality of third openings 51 of the second common voltage transmitting line 500b. End portions of the second common voltage transmitting line 500b may be positioned not on the first spacer portion SP11 and the second spacer portion SP21, but on a top surface of the third spacer portion SP12 and a top surface of the fourth spacer portion SP22, where the top surface is furthest from the substrate 110. The second auxiliary electrode 502 may be simultaneously provided or formed with the common electrode 730. That is, the second auxiliary electrode 502 and the common electrode 730 may be in a same layer as each other. The second auxiliary electrode 502 is not directly connected to the common electrode 730 of the display area DA.

As similarly described above, in the display device 1000 of FIG. 9, the common voltage transmitting line 500 disposed in the non-display area NDA is formed as a double-layered structure including a first common voltage transmitting line 500a and a second common voltage transmitting line 500b respectively disposed above and below the first interlayer insulating film 160 including an organic material. The first common voltage transmitting line 500a and a second common voltage transmitting line 500b which face each other contact each other to be connected to each other at the first opening 61 and the second opening 62 in the first interlayer insulating film 160, thereby reducing electrical signal resistance of the common voltage transmitting line 500 and reducing power consumption. The second common voltage transmitting line 500b disposed on the first interlayer insulating film 160 including an organic material includes a plurality of third openings 51 to outgas the processing gas generated by the organic material during the manufacturing process to the outside, thereby reducing or effectively preventing peeling off of the second common voltage transmitting line 500b from the first interlayer insulating film 160 by the processing gas. The second auxiliary electrode 502 is disposed on the second common voltage transmitting line 500b to cover a plurality of third openings 51 of the second common voltage transmitting line 500b, thereby reducing or effectively preventing the electrical signal resistance of the second common voltage transmitting line 500b from increasing by the plurality of third openings 51.

Many features according to the above-described embodiments are applicable to the display device 1000 according to the embodiment in FIG. 9.

A method for manufacturing a display device 1000 will now be described with reference to FIG. 9 together with FIG. 10 to FIG. 13. FIG. 10 to FIG. 13 show cross-sectional views of an embodiment of a method for manufacturing a display device 1000.

Figure 10:
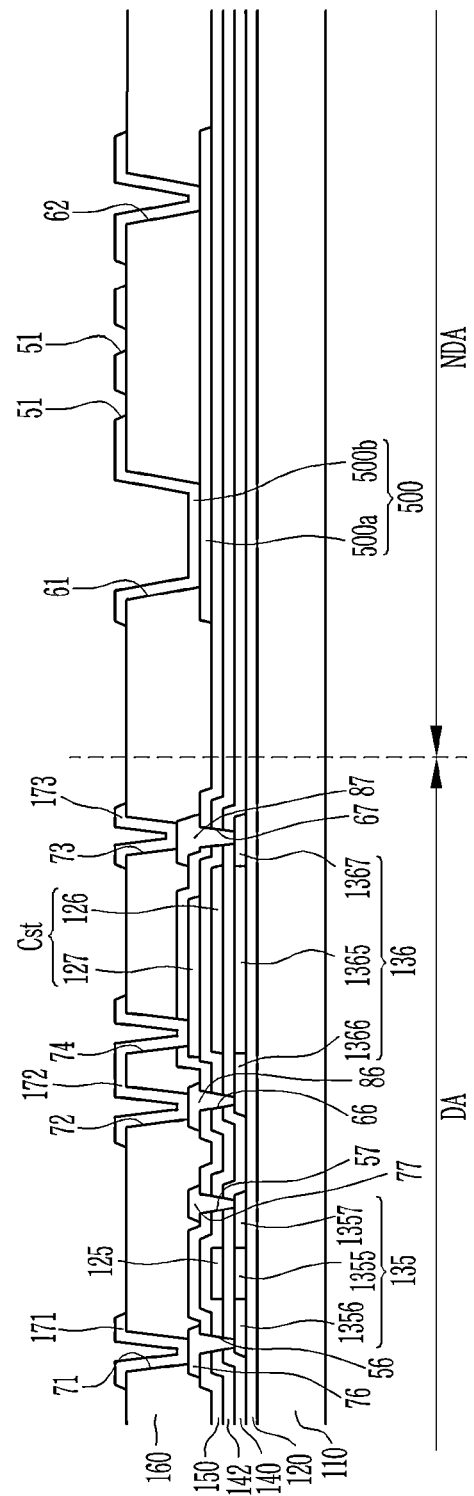
FIG. 10 to FIG. 13 show cross-sectional views of an embodiment of a method for providing the display device of FIG. 9.

Referring to FIG. 9 and FIG. 10, a buffer layer 120 is stacked on the substrate 110, a first semiconductor layer 135 and a second semiconductor layer 136 are provided or formed on the buffer layer 120 such as by a first photolithography process, a first gate insulating film 140 is stacked on the first semiconductor layer 135 and the second semiconductor layer 136, a first gate electrode 125 and a second gate electrode 126 are provided or formed on the first gate insulating film 140 such as by a second photolithography process, and the first gate electrode 125 and the second gate electrode 126 are used as masks and impurities are applied to the first semiconductor layer 135 and the second semiconductor layer 136 to provide or form a first source region 1356 and a first drain region 1357 on respective sides of a first channel region 1355 and a second source region 1366 and a second drain region 1367 on respective sides of a second channel region 1365.

A second gate insulating film 142 is stacked on the first gate electrode 125 and the second gate electrode 126, a storage electrode 127 is provided or formed such as by a third photolithography process, a first insulating layer 150 is stacked on the storage electrode 127, a first contact hole 56, a second contact hole 57, a third contact hole 66, and a fourth contact hole 67 are formed in the first gate insulating film 140, the second gate insulating film 142, and the first insulating layer 150 such as by a fourth photolithography process, and a first common voltage transmitting line 500a of the common voltage transmitting line 500 is provided or formed together with a first input electrode 76, a first output electrode 77, a second input electrode 86, and a second output electrode 87 such as by a fifth photolithography process.

A first interlayer insulating film 160 including an organic material is stacked, and a first opening 61 and a second opening 62 are provided or formed in the first interlayer insulating film 160 together with a fifth contact hole 71, a sixth contact hole 72, a seventh contact hole 73, and an eighth contact hole 74 such as by a sixth photolithography process.

A second common voltage transmitting line 500b including a plurality of third openings 51 is provided or formed on the first interlayer insulating film 160 together with a data line 171, a driving voltage line 172, and an output member 173 by a seventh photolithography process.

Figure 11:
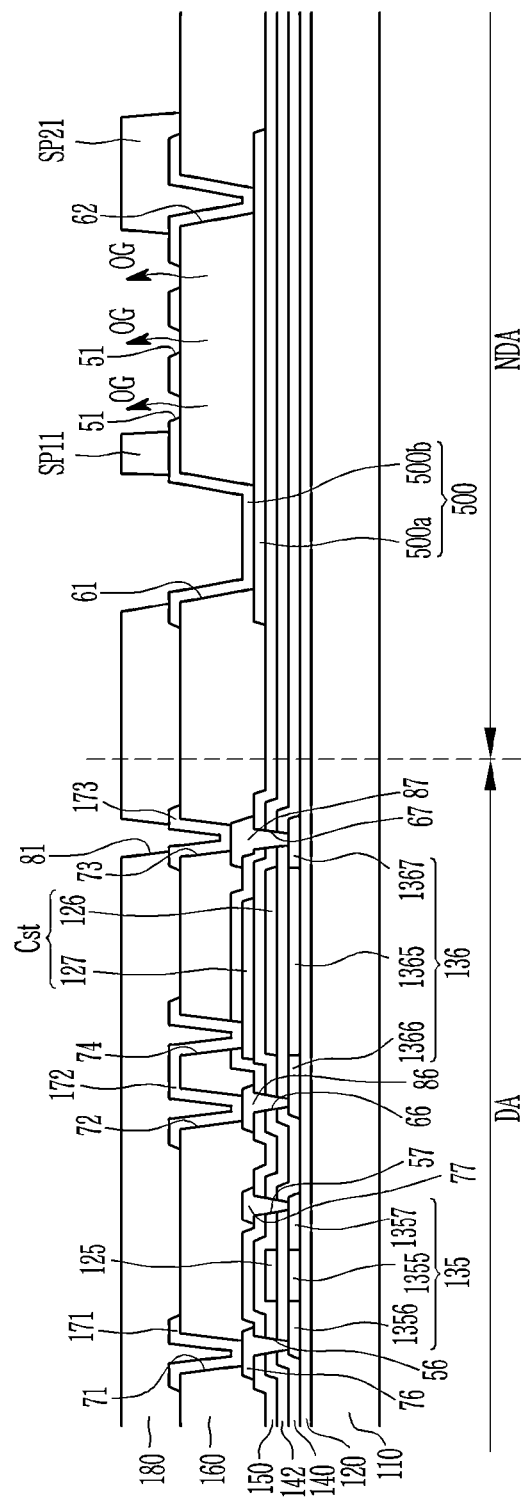

As shown in FIG. 11, a second interlayer insulating film 180 is stacked, a ninth contact hole 81 is provided formed in the second interlayer insulating film 180 such as by an eighth photolithography process, and a first spacer portion SP11 and a second spacer portion SP21 are provided or formed. Here, during the curing process of the second interlayer insulating film 180, the processing gas generated by the first interlayer insulating film 160 disposed below the second common voltage transmitting line 500b may be outgassed OG through the third openings 51 of the second common voltage transmitting line 500b.

Figure 12:
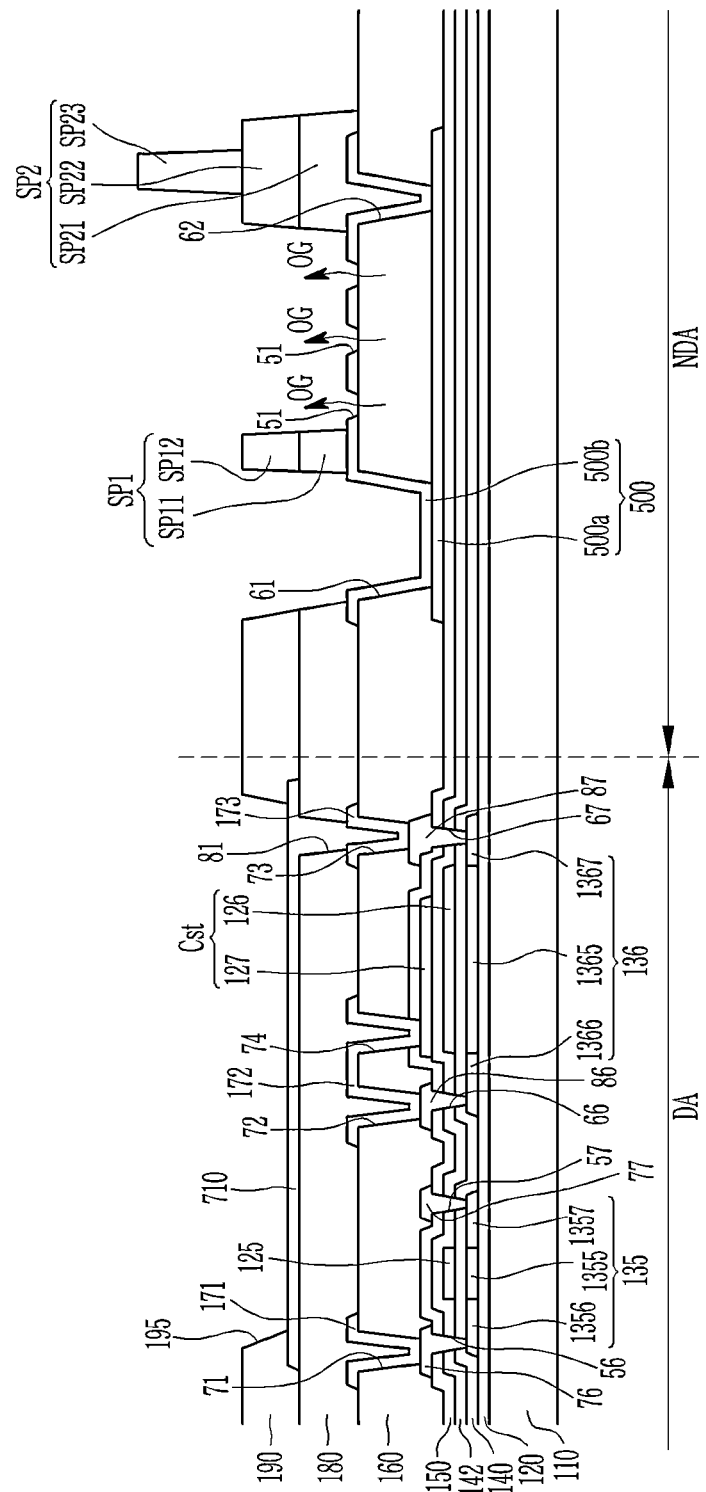

As shown in FIG. 12, a pixel electrode 710 is provided or formed such as by a ninth photolithography process, and a pixel defining layer 190, a third spacer portion SP12, a fourth spacer portion SP22, and a fifth spacer portion SP23 are provided or formed such as by a tenth photolithography process. In an embodiment, the fifth spacer portion SP23 may be provided or formed by another photolithography process different from the tenth photolithography process. In this instance, during a curing process of the pixel defining layer 190, the processing gas generated by the first interlayer insulating film 160 disposed below the second common voltage transmitting line 500b may be outgassed OG through the third openings 51 of the second common voltage transmitting line 500b.

Figure 13:
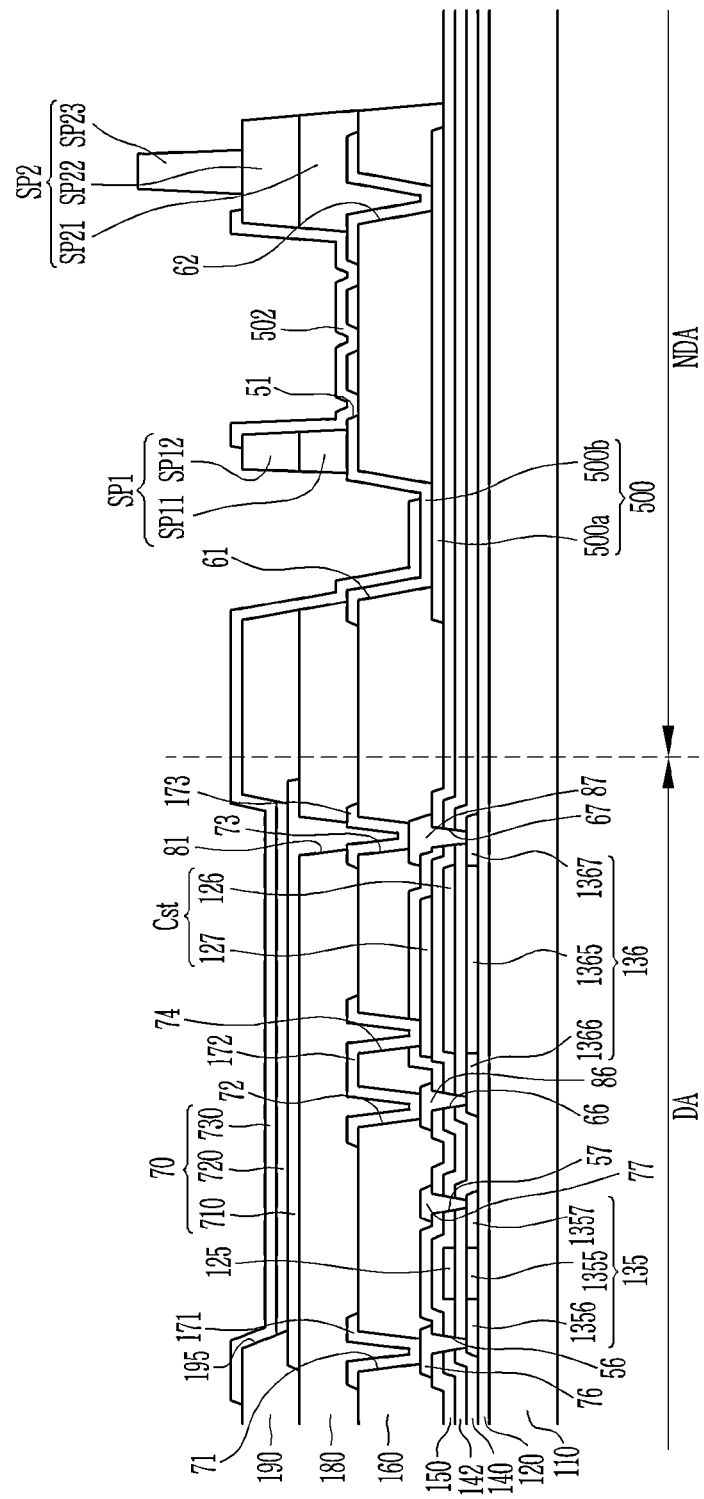

As shown in FIG. 13, an organic emission layer 720 is provided or formed, and a second auxiliary electrode 502 is provided or formed together with a common electrode 730 such as by a ninth photolithography process. An encapsulation layer 80 is then or provided or formed, thereby providing the display device 1000 shown in FIG. 9.

According to one or more embodiment of the method for manufacturing a display device 1000, during a curing process of an insulating layer, processing gas generated by the first interlayer insulating film 160 disposed below the second common voltage transmitting line 500b may be outgassed OG through the third openings 51 of the second common voltage transmitting line 500b. Therefore, different from the comparative display device, as shown in FIG. 5, peeling off of the second common voltage transmitting line 500b from the first interlayer insulating film 160 by the processing gas may be reduced or effectively prevented.

Figure 14:
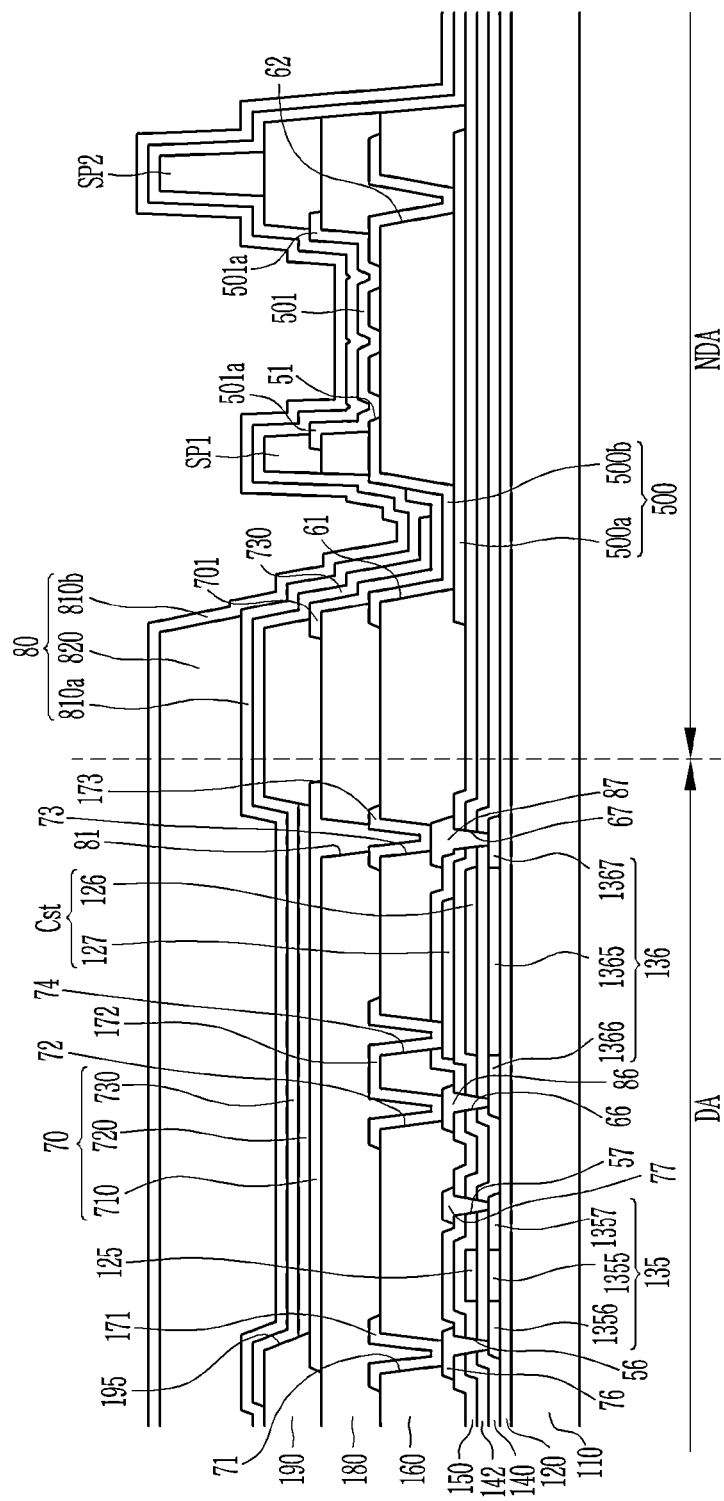
FIG. 14 shows a cross-sectional view of an embodiment of a display device.

An embodiment of a display device 1000 will now be described with reference to FIG. 14. FIG. 14 shows a cross-sectional view of a display device 1000.

Referring to FIG. 14, the display device 1000 is similar to the display device 1000 described with reference to FIG. 1, FIG. 2, FIG. 3 and FIG. 4. No detailed descriptions on the same constituent elements will be provided.

However, according to the display device 1000 in FIG. 14, at the first opening 61 of the first interlayer insulating film 160 of the non-display area NDA, a connecting member 701 is disposed between the common voltage transmitting line 500 and the common electrode 730.

The connecting member 701 may be simultaneously with the pixel electrode 710, and supports electrical connection between the common voltage transmitting line 500 and the common electrode 730. The common electrode 730 is disposed on the first interlayer insulating film 160 including an organic material that is relatively thick, the second interlayer insulating film 180 and the pixel defining layer 190, so the common electrode 730 may be short-circuited by a step of these layers, such that the electrical connection between the common electrode 730 and the common voltage transmitting line 500 may be unstable. However, according to the display device 1000 in FIG. 14, the connecting member 701 electrically connects the common voltage transmitting line 500 and the common electrode 730 to each other and is provided in a same layer as the pixel electrode 710, so the common voltage transmitting line 500 may be electrically connected to the common electrode 730 through the connecting member 701.

As similarly described above for the embodiment with reference to FIG. 1 and FIG. 2 FIG. 3 and FIG. 4, in the display device 1000 of FIG. 14, the common voltage transmitting line 500 disposed in the non-display area NDA is provided or formed to be a double layered-structure including a first common voltage transmitting line 500a and a second common voltage transmitting line 500b respectively disposed below and above the first interlayer insulating film 160 including an organic material. The first common voltage transmitting line 500a and a second common voltage transmitting line 500b which face each other are connected to each other by contacting each other at the first opening 61 and the second opening 62 in the first interlayer insulating film 160, thereby reducing electrical signal resistance of the common voltage transmitting line 500 and accordingly reducing power consumption. The second common voltage transmitting line 500b disposed on the first interlayer insulating film 160 including an organic material includes a plurality of third openings 51 to outgas the processing gas generated by the organic material during the manufacturing process to the outside, thereby reducing or effectively preventing peeling off of the second common voltage transmitting line 500b from the first interlayer insulating film 160 by the processing gas. The first auxiliary electrode 501 is disposed on the second common voltage transmitting line 500b to cover a plurality of third openings 51 of the second common voltage transmitting line 500b, thereby reducing or effectively preventing the electrical signal resistance of the second common voltage transmitting line 500b from increasing by the plurality of third openings 51.

Many features according to the above-described embodiments are applicable to the display device 1000 according to the embodiment in FIG. 14.

Figure 15:
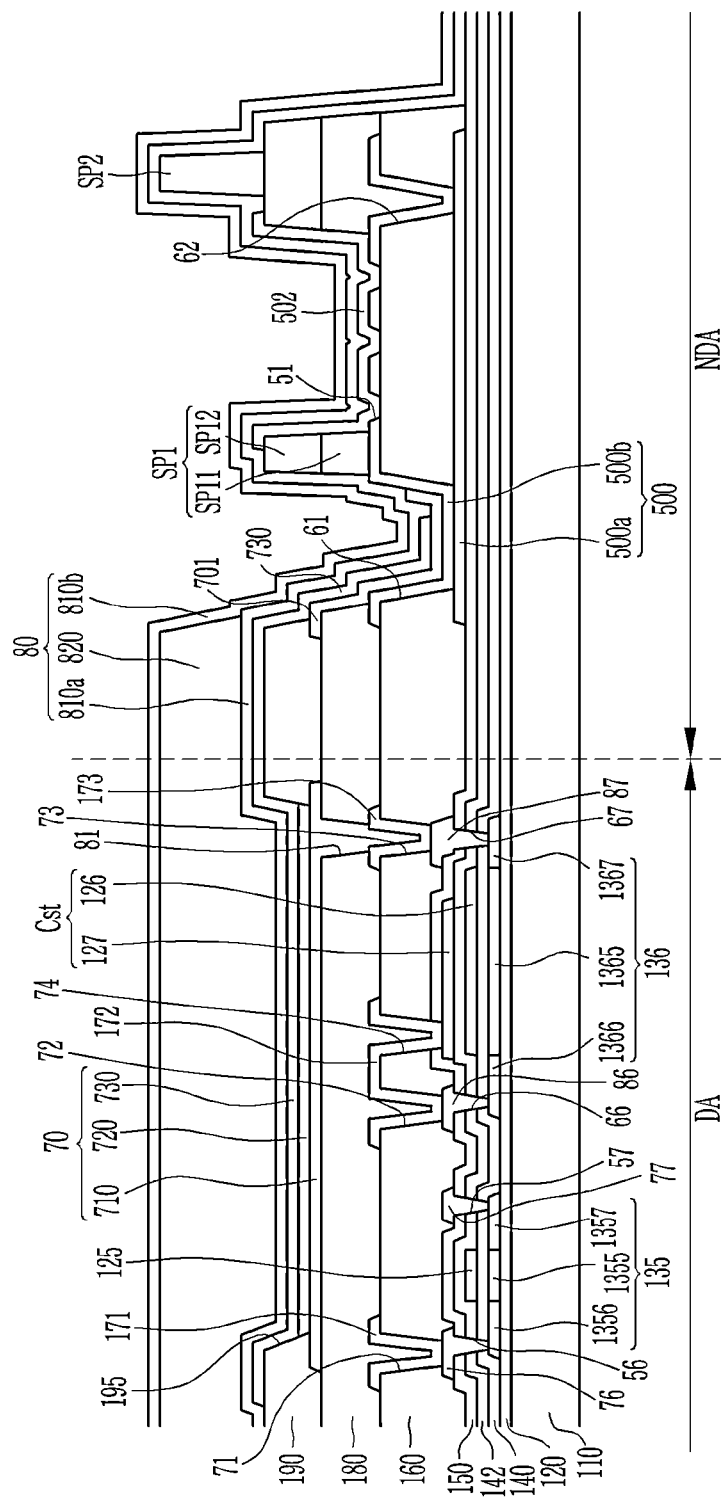
FIG. 15 shows a cross-sectional view of an embodiment of a display device.

An embodiment of a display device 1000 will now be described with reference to FIG. 15. FIG. 15 shows a cross-sectional view of a display device 1000.

Referring to FIG. 15, the display device 1000 is similar to the display device 1000 described with reference to FIG. 9. No detailed descriptions on the same constituent elements will be provided.

However, according to the display device 1000 in FIG. 15, differing from the display device 1000 described with reference to FIG. 9, at the first opening 61 of the first interlayer insulating film 160 of the non-display area NDA, a connecting member 701 is disposed between the common voltage transmitting line 500 and the common electrode 730.

The connecting member 701 may be simultaneously provided or formed with the pixel electrode 710, and supports electrical connection between the common voltage transmitting line 500 and the common electrode 730. When the common electrode 730 is short-circuited at lateral sides of organic insulating layers by steps of a plurality of organic insulating layers disposed below the common electrode 730, the common voltage transmitting line 500 may be electrically connected to the common electrode 730 by the connecting member 701 in a same layer as the pixel electrode 710.

As similarly described above, according to the display device 1000 in FIG. 15, the common voltage transmitting line 500 disposed in the non-display area NDA is provided or formed to be a double-layered structure including a first common voltage transmitting line 500a and a second common voltage transmitting line 500b respectively disposed below and above the first interlayer insulating film 160 including an organic material. The first common voltage transmitting line 500a and a second common voltage transmitting line 500b which face each other are connected to each other by contacting each other at the first opening 61 and the second opening 62 in the first interlayer insulating film 160, thereby reducing electrical signal resistance of the common voltage transmitting line 500 and accordingly reducing power consumption. The second common voltage transmitting line 500b disposed on the first interlating film 160 including an organic material includes a plurality of third openings 51 to outgas the processing gas generated by the organic material during the manufacturing process to the outside, thereby reducing or effectively preventing peeling off of the second common voltage transmitting line 500b from the first interlayer insulating film 160 by the processing gas. The second auxiliary electrode 502 in a same layer as the common electrode 730 is disposed on the second common voltage transmitting line 500b to cover a plurality of third openings 51 of the second common voltage transmitting line 500b, thereby reducing or effectively preventing the electrical signal resistance of the second common voltage transmitting line 500b from increasing by the plurality of third openings 51.

Many features according to the above-described embodiments are applicable to the display device 1000 according to the embodiment in FIG. 15.

Figure 16:
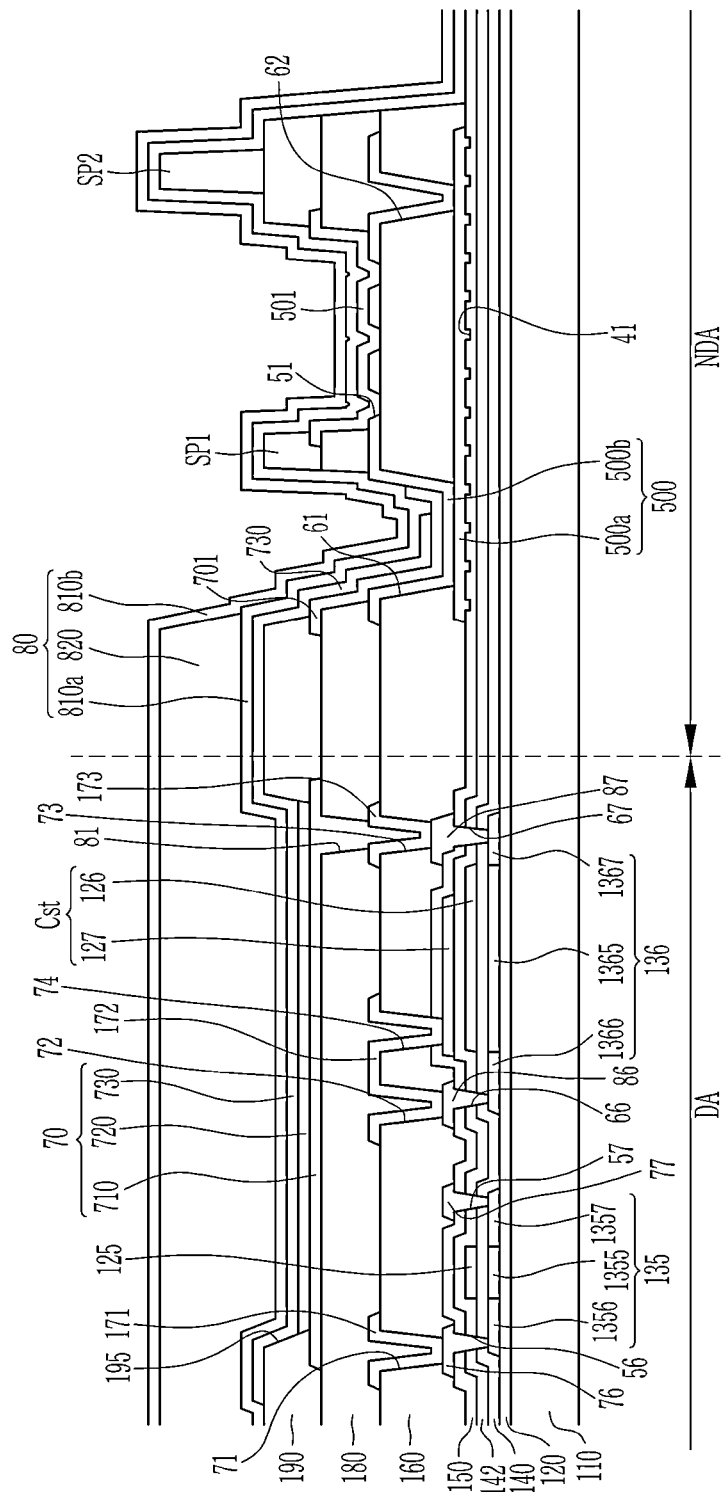
FIG. 16 shows a cross-sectional view of an embodiment of a display device.

A display device 1000 will now be described with reference to FIG. 16. FIG. 16 shows a cross-sectional view of a display device 1000.

Referring to FIG. 16, the display device 1000 is similar to the display device 1000 described with reference to FIG. 2 and FIG. 14. No detailed descriptions on the same constituent elements will be provided.

However, according to the display device 1000 in FIG. 16, a recess portion 41 (e.g., recess) provided in plural including a plurality of recess portions 41 (e.g., recesses) are defined extended from a top surface of the first insulating layer 150 disposed below the first common voltage transmitting line 500a of the non-display area NDA. A plurality of recess portions 41 increase a contact area between the first insulating layer 150 and the first common voltage transmitting line 500a to improve a contact characteristic of the first insulating layer 150 and the first common voltage transmitting line 500a and reduce or effectively prevent separation of the first common voltage transmitting line 500a from the first insulating layer 150. By this, passing of moisture that may be input from outside the first insulating layer 150 through a space between the first insulating layer 150 and the first common voltage transmitting line 500a and being input to the display area DA may be reduced or effectively prevented.

As similarly described above, in the display device 1000 of FIG. 16, the common voltage transmitting line 500 disposed in the non-display area NDA is provided or formed to be a double-layered structure including a first common voltage transmitting line 500a and a second common voltage transmitting line 500b respectively disposed below and above the first interlayer insulating film 160 including an organic material. The first common voltage transmitting line 500a and a second common voltage transmitting line 500b which face each other are connected to each other by contacting each other at the first opening 61 and the second opening 62 in the first interlayer insulating film 160, thereby reducing electrical signal resistance of the common voltage transmitting line 500 and accordingly reducing power consumption. The second common voltage transmitting line 500b disposed on the first interlayer insulating film 160 including an organic material includes a plurality of third openings 51 to outgas the processing gas generated by the organic material during the manufacturing process to the outside, thereby reducing or effectively preventing peeling off of the second common voltage transmitting line 500b from the first interlayer insulating film 160 by the processing gas. The first auxiliary electrode 501 is disposed on the second common voltage transmitting line 500b to cover a plurality of third openings 51 of the second common voltage transmitting line 500b, thereby reducing or effectively preventing the electrical signal resistance of the second common voltage transmitting line 500b from increasing by the plurality of third openings 51.

Many features according to the above-described embodiments are applicable to the display device 1000 of FIG. 16.

Figure 17:
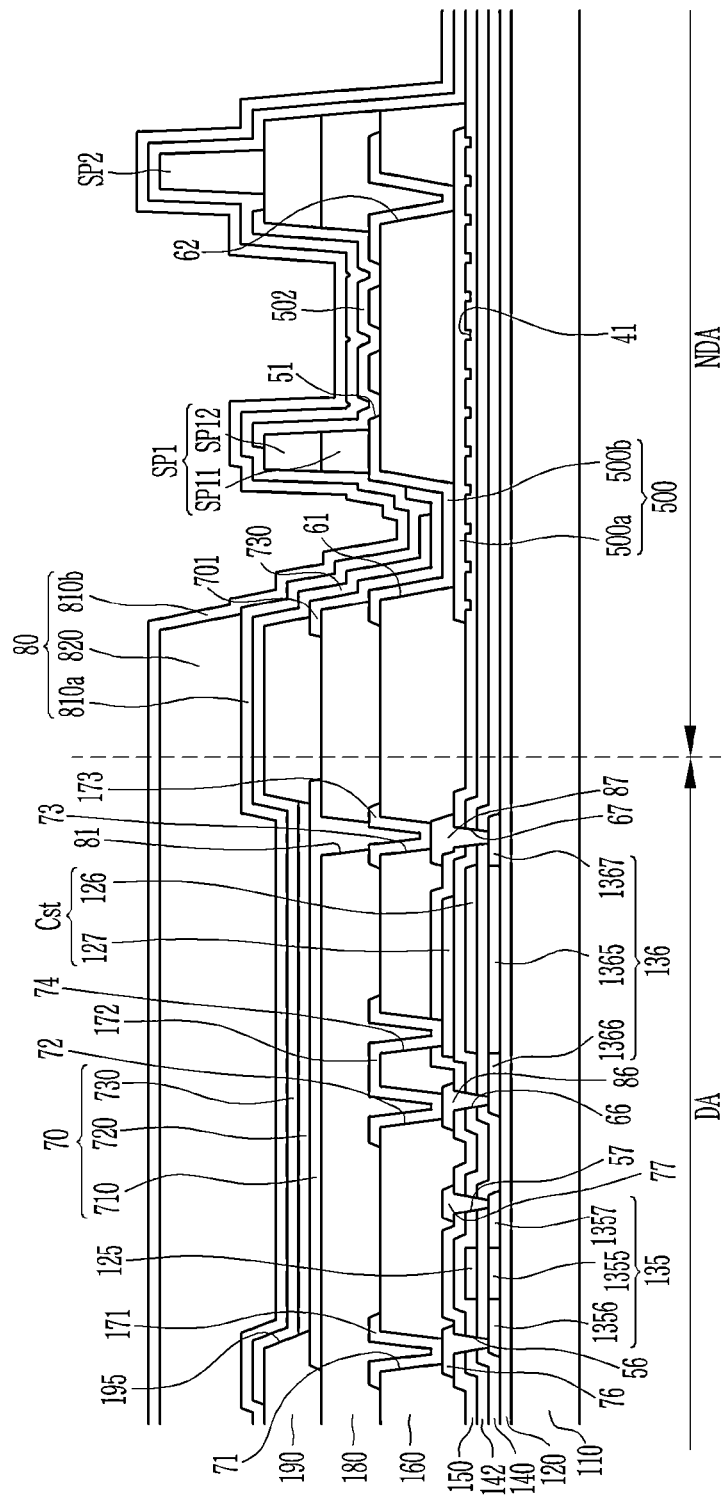
FIG. 17 shows a cross-sectional view of an embodiment of a display device.

An embodiment of a display device 1000 will now be described with reference to FIG. 17. FIG. 17 shows a cross-sectional view of a display device 1000.

Referring to FIG. 17, the display device 1000 is similar to the display device 1000 described with reference to FIG. 9 and FIG. 15. No detailed descriptions on the same constituent elements will be provided.

However, according to the display device 1000 in FIG. 17, a plurality of recess portions 41 are defined extended from a top surface of the first insulating layer 150 disposed below the first common voltage transmitting line 500a of the non-display area NDA. A plurality of recess portions 41 increase a contact area of the first insulating layer 150 and the first common voltage transmitting line 500a to improve a contact characteristic of the first insulating layer 150 and the first common voltage transmitting line 500a and reduce or effectively prevent separation of the first common voltage transmitting line 500a from the first insulating layer 150. By this, passing of moisture that may be input from outside the first insulating layer 150 through a space between the first insulating layer 150 and the first common voltage transmitting line 500a and being input to the display area DA may be reduced or effectively prevented.

As similarly described above, in the display device of FIGS. 1, 17, the common voltage transmitting line 500 disposed in the non-display area NDA is provided or formed to be double-layered structure including a first common voltage transmitting line 500a and a second common voltage transmitting line 500b respectively disposed below and above the first interlayer insulating film 160 including an organic material. The first common voltage transmitting line 500a and a second common voltage transmitting line 500b which face each other are connected to each other by contacting each other through the first opening 61 and the second opening 62 in the first interlayer insulating film 160, thereby reducing electrical signal resistance of the common voltage transmitting line 500 and accordingly reducing power consumption. The second common voltage transmitting line 500b disposed on the first interlayer insulating film 160 including an organic material includes a plurality of third openings 51 to outgas the processing gas generated by the organic material during the manufacturing process to the outside, thereby reducing or effectively preventing peeling off of the second common voltage transmitting line 500b from the first interlayer insulating film 160 by the processing gas. The second auxiliary electrode 502 is disposed on the second common voltage transmitting line 500b to cover a plurality of third openings 51 of the second common voltage transmitting line 500b, thereby reducing or effectively preventing the electrical signal resistance of the second common voltage transmitting line 500b from increasing by the plurality of third openings 51.

Many features according to the above-described embodiments are applicable to the display device 1000 in FIG. 17.

While this disclosure has been described in connection with embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
    a substrate including a display area at which an image is displayed and a non-display area which is adjacent to the display area; and
    in the non-display area:
        a common voltage transmitting line which is connected to the display area and through which a common voltage is provided to the display area;
        an organic insulating layer between the common voltage transmitting line and the substrate;
        a first opening which is in the common voltage transmitting line and exposes the organic insulating layer to outside the common voltage transmitting line; and
        an auxiliary electrode which faces the organic insulating layer with the common voltage transmitting line therebetween, contacts the common voltage transmitting line at the first opening and covers the first opening.

2. The display device of claim 1, further comprising in the display area, a first electrode, a second electrode facing the first electrode, and an organic emission layer between the first electrode and the second electrode,
wherein
the common voltage transmitting line is connected to the second electrode, and
the auxiliary electrode is in a same layer as the first electrode.

3. The display device of claim 2, further comprising in the non-display area:
a second opening which is in the organic insulating layer and between the display area and the first opening, and
the common voltage transmitting line is provided in plural including:
a first common voltage transmitting line between the organic insulating layer and the substrate, and
a second common voltage transmitting line which is between the organic insulating layer and the auxiliary electrode and defines the first opening,
wherein the first common voltage transmitting line is connected to the second common voltage transmitting line at the second opening.

4. The display device of claim 3, wherein
the second opening exposes the common voltage transmitting line to outside the organic insulating layer,
the second electrode which is in the display area extends to the non-display area and defines an end portion of the second electrode which is in the second opening and contacts the common voltage transmitting line which is exposed at the second opening, and
the auxiliary electrode which contacts the common voltage transmitting line at the first opening is connected to the second electrode by contact at the second opening of the second electrode with the common voltage transmitting line.

5. The display device of claim 4, further comprising in the second opening of the non-display area, a connecting member which is between the end portion of the second electrode and the common voltage transmitting line and electrically connects the second electrode to the common voltage transmitting line,
wherein the connecting member is in a same layer as the first electrode.

6. The display device of claim 3, further comprising in the non-display area:
an insulating layer facing the organic insulating layer with the first common voltage transmitting line therebetween, and
a plurality of recess portions in the insulating layer and into which the first common voltage transmitting line extends.

7. A display device comprising:
a substrate including a display area at which an image is displayed and a non-display area which is adjacent to the display area;
in the display area:
a transistor including a semiconductor layer, a gate electrode, an input electrode and an output electrode,
a data line connected to the transistor,
a driving voltage line in a same layer as the data line, and
an organic light emitting element including a first electrode, an organic emission layer and a second electrode;
in the non-display area, a first common voltage transmitting line which is connected to the organic light emitting element and through which a common voltage is provided to the organic light emitting element, the first common voltage transmitting line in a same layer as the input electrode and the output electrode of the transistor;
a first organic insulating layer facing the substrate with the transistor of the display area and the first common voltage transmitting line of the non-display area therebetween;
in the non-display area:
a second common voltage transmitting line which faces the first common voltage transmitting line with the first organic insulating layer therebetween, and at the non-display area, is connected to the first common voltage transmitting line;
an opening which is in the second common voltage transmitting line and exposes the first organic insulating layer to outside the second common voltage transmitting line, and
an auxiliary electrode which faces the first organic insulating layer with the second common voltage transmitting line therebetween, contacts the second common voltage transmitting line at the opening and covers the opening; and
a second organic insulating layer facing the first organic insulating layer with each of the data line and the driving voltage line of the display area and the second common voltage transmitting line of the non-display area therebetween.

8. The display device of claim 7, wherein
the second electrode which is in the display area extends to the non-display area and within the non-display area, is connected to the second common voltage transmitting line, and
the auxiliary electrode which contacts the second common voltage transmitting line at the opening of the non-display area is connected to the second electrode by connection within the non-display area of the second electrode with the second common voltage transmitting line.

9. The display device of claim 7, wherein the first common voltage transmitting line of the non-display area is in a same layer as the input electrode and the output electrode of the display area.

10. The display device of claim 9, wherein the second common voltage transmitting line of the non-display area is in a same layer as the data line and the driving voltage line of the display area.

11. The display device of claim 10, wherein the auxiliary electrode of the non-display area is in a same layer as the first electrode of the organic light emitting element of the display area.

12. The display device of claim 11, further comprising in the non-display area, a connecting member which is between the second electrode and the second common voltage transmitting line and electrically connects the second electrode to the second common voltage transmitting line,
wherein the connecting member is in a same layer as the first electrode of the organic light emitting element.

13. The display device of claim 12, further comprising:
a first insulating layer facing the first organic insulating layer with each of the gate electrode, the input electrode and the output electrode of the display area and the first common voltage transmitting line of the non-display area therebetween, and
in the non-display area, a plurality of recess portions in the first insulating layer and into which the first common voltage transmitting line extends.

14. The display device of claim 10, wherein the auxiliary electrode of the non-display area and the second electrode of the organic light emitting element of the display area are in a same layer as each other.

15. The display device of claim 8, further comprising in the non-display area, a connecting member which is between the second electrode and the second common voltage transmitting line and electrically connects the second electrode to the second common voltage transmitting line,
wherein the connecting member is in a same layer as the first electrode of the organic light emitting element.

16. The display device of claim 15, further comprising:
a first insulating layer facing the first organic insulating layer with the gate electrode, the input electrode and the output electrode of the display area and the first common voltage transmitting line of the non-display area therebetween, and
in the non-display area, a plurality of recess portions in the first insulating layer and into which the first common voltage transmitting line extends.

17. A display device including:
a display area at which an image is displayed and a non-display area which is adjacent to the display area;
the display area including in order:
a semiconductor layer of a transistor,
a first insulating layer,
a gate electrode of the transistor which corresponds to the semiconductor layer,
a second insulating layer,
a storage electrode of a capacitor,
a third insulating layer,
a layer including an input electrode and an output electrode of the transistor which are connected to the semiconductor layer,
a first organic insulating layer,
a layer including a data line connected to the transistor and a driving voltage line,
a second organic insulating layer,
a first electrode of an organic light emitting element,
a pixel defining layer in which a pixel opening is defined corresponding to the first electrode of the organic light emitting element,
an emission layer of the organic light emitting element which is in the pixel opening, and
a second electrode of the organic light emitting element which corresponds to the emission layer, and
the non-display area including in order:
the third insulating layer which is extended from the display area,
a first common voltage transmitting line which is connected to the organic light emitting element and through which a common voltage is provided to the organic light emitting element,
the first organic insulating layer which is extended from the display area and in which are defined in order from the display area, a first opening and a second opening,
a second common voltage transmitting line which is connected to the first common voltage transmitting line at both the first opening and the second opening in the first organic insulating layer, and defines a third opening which is between the first opening and the second opening and exposes the first organic insulating layer to outside the second common voltage transmitting line,
an auxiliary electrode which contacts the second common voltage transmitting line at the third opening and covers the third opening, and
a layer including a first spacer and a second spacer having different heights from each other,
wherein the second electrode which is in the display area extends to the non-display area and is connected to the second common voltage transmitting line within the first opening in the first organic insulating layer.

18. The display device of claim 17, wherein
the first common voltage transmitting line of the non-display area is in a same layer as the input electrode and the output electrode of the display area,
the second common voltage transmitting line of the non-display area is in a same layer as the data line and the driving voltage line of the display area, and
the auxiliary electrode of the non-display area is in a same layer as the first electrode or the second electrode of the organic light emitting element of the display area.

19. The display device of claim 18, wherein
the third opening of the second common voltage transmitting line is between the first spacer and the second spacer,
the second common voltage transmitting line includes a first portion in the first opening and a second portion in the second opening, and
the third opening of the second common voltage transmitting line is between the first portion of the second common voltage transmitting and the second portion of the second common voltage transmitting line.

20. The display device of claim 17, further comprising:
a thin film encapsulation layer covering the display area and the non-display area and including an inorganic encapsulation layer and an organic encapsulation layer,
wherein in the non-display area:
the first spacer includes:
a first layer in a same layer as the second organic insulating layer, and
a second layer in a same layer as the pixel defining layer,
the second spacer includes:
a first layer in a same layer as the second organic insulating layer,
a second layer in a same layer as the pixel defining layer, and
a third layer including an organic material and facing the first layer of the second spacer with the second layer thereof therebetween,
the inorganic encapsulation layer of the thin film encapsulation layer corresponds to the first spacer and the second spacer, and
the organic encapsulation layer of the thin film encapsulation layer is closer to the display area than both the first spacer and the second spacer.

* * * * *